(12) United States Patent
Lin et al.

(10) Patent No.: US 12,019,097 B2
(45) Date of Patent: Jun. 25, 2024

(54) METHOD FOR FORMING PROBE HEAD STRUCTURE

(71) Applicant: Taiwan Semiconductor Manufacturing Company, Ltd., Hsinchu (TW)

(72) Inventors: Wen-Yi Lin, New Taipei (TW); Hao Chen, New Taipei (TW); Chuan-Hsiang Sun, Taoyuan (TW); Mill-Jer Wang, Hsinchu (TW); Chien-Chen Li, Hsinchu (TW); Chen-Shien Chen, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 242 days.

(21) Appl. No.: 17/460,803

(22) Filed: Aug. 30, 2021

(65) Prior Publication Data
US 2023/0065443 A1 Mar. 2, 2023

(51) Int. Cl.
*G01R 1/067* (2006.01)
*G01R 31/28* (2006.01)

(52) U.S. Cl.
CPC ...... *G01R 1/06761* (2013.01); *G01R 1/06733* (2013.01); *G01R 1/06794* (2013.01); *G01R 31/2851* (2013.01)

(58) Field of Classification Search
CPC ............ G01R 1/06761; G01R 1/06733; G01R 1/06794; G01R 31/2851; G01R 1/06744; H05K 3/4007; Y10T 29/4913; Y10T 29/49146
See application file for complete search history.

(56) References Cited

U.S. PATENT DOCUMENTS

| | | | | |
|---|---|---|---|---|
| 5,042,148 A | * | 8/1991 | Tada | G01R 1/07314 29/846 |
| 6,305,230 B1 | * | 10/2001 | Kasukabe | G01R 31/2889 73/855 |
| 6,586,955 B2 | * | 7/2003 | Fjelstad | G01R 1/07314 324/754.07 |
| 6,773,938 B2 | * | 8/2004 | Wood | H05K 3/4007 324/756.03 |
| 10,861,799 B1 | * | 12/2020 | Wu | H01L 25/0655 |

* cited by examiner

*Primary Examiner* — Donghai D Nguyen
(74) *Attorney, Agent, or Firm* — McClure, Qualey & Rodack, LLP

(57) ABSTRACT

A probe head structure is provided. The probe head structure includes a flexible substrate having a top surface and a bottom surface. The probe head structure includes a first probe pillar passing through the flexible substrate. The first probe pillar has a first protruding portion protruding from the bottom surface. The probe head structure includes a redistribution structure on the top surface of the flexible substrate and the first probe pillar. The redistribution structure is in direct contact with the flexible substrate and the first probe pillar. The redistribution structure includes a dielectric structure and a wiring structure in the dielectric structure. The wiring structure is electrically connected to the first probe pillar. The probe head structure includes a wiring substrate over the redistribution structure. The probe head structure includes a first conductive bump connected between the wiring substrate and the redistribution structure.

20 Claims, 23 Drawing Sheets

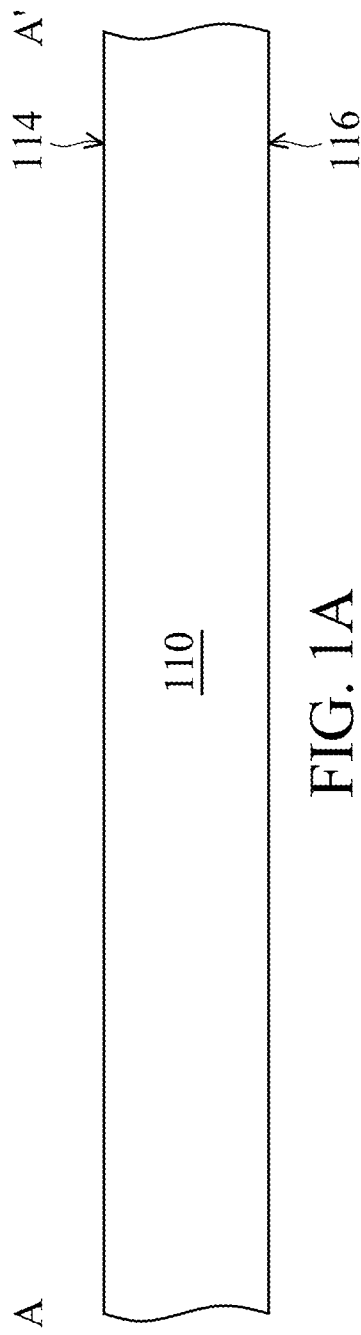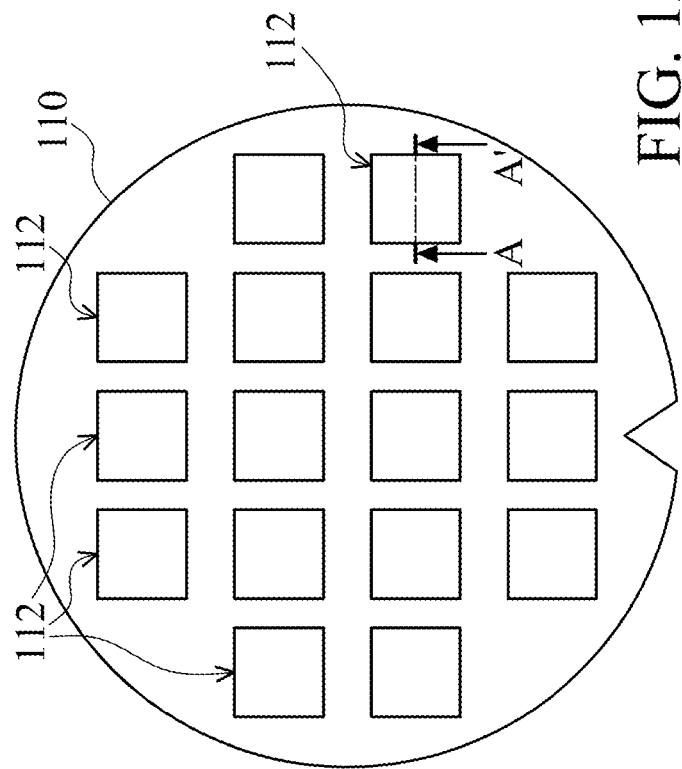
FIG. 1A
FIG. 1A-1

METHOD FOR FORMING PROBE HEAD STRUCTURE

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes. There is a need to test the semiconductor devices using a probe head structure to check electrical performance of the semiconductor devices.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1M are cross-sectional views of various stages of a process for forming a probe head structure, in accordance with some embodiments.

FIG. 1A-1 is a top view of a substrate of FIG. 1A, in accordance with some embodiments.

FIG. 1E-1 is an enlarged view of a conductive layer in a region of FIG. 1E, in accordance with some embodiments.

DETAILED DESCRIPTION

Figure 1B:
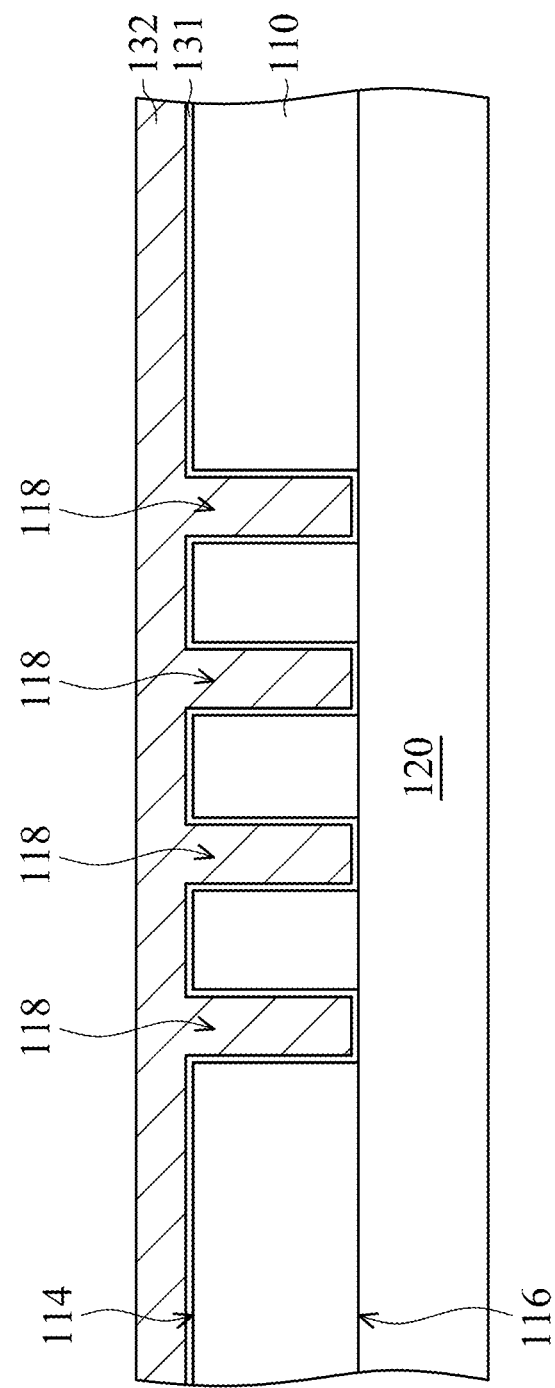

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1M are cross-sectional views of various stages of a process for forming a probe head structure, in accordance with some embodiments. FIG. 1A-1 is a top view of a substrate of FIG. 1A, in accordance with some embodiments. FIG. 1A is a cross-sectional view illustrating the substrate along a sectional line A-A' in FIG. 1A-1, in accordance with some embodiments.

As shown in FIGS. 1A and 1A-1, a substrate 110 is provided, in accordance with some embodiments. The substrate 110 has regions 112, in accordance with some embodiments. The regions 112 are arranged in an array, in accordance with some embodiments.

As shown in FIG. 1A, the substrate 110 has surfaces 114 and 116, in accordance with some embodiments. The surfaces 114 and 116 are opposite to each other, in accordance with some embodiments. The substrate 110 is also referred to as a flexible substrate, in accordance with some embodiments. The substrate 110 includes, for example, a wafer or a portion of a wafer.

The substrate 110 is made of a flexible material, such as a glass material, a semiconductor material, a polymer material, or another suitable material, which is able to provide sufficient support to probe pillars, which are formed in the substrate 110 in subsequent processes, and has sufficient flexibility, in accordance with some embodiments. The flexible material may have a good chemical resistance, in accordance with some embodiments.

The substrate 110 has a Young's modulus ranging from about 60 GPa to about 85 GPa, in accordance with some embodiments. The substrate 110 has a coefficient of thermal expansion (CTE) ranging from about 1 ppm/° C. to about 8 ppm/° C., in accordance with some embodiments.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1B, the substrate 110 is disposed over a carrier substrate 120, in accordance with some embodiments. The carrier substrate 120 is used to support the substrate 110, in accordance with some embodiments. The carrier substrate 120 is made of metal, glass, semiconductor material (e.g., silicon), polymer, the like, or another suitable material, in accordance with some embodiments.

As shown in FIG. 1B, portions of the substrate 110 are removed to form through holes 118 in the substrate 110, in accordance with some embodiments. The through holes 118 expose portions of the carrier substrate 120, in accordance with some embodiments. The removal process includes an etching process (such as a dry etching process) or a drilling process (such as a laser drilling process), in accordance with some embodiments.

As shown in FIG. 1B, a seed layer 131 is conformally formed over the surface 114 of the substrate 110 and in the through holes 118 and over the carrier substrate 120 exposed by the through holes 118, in accordance with some embodiments. The seed layer 131 is made of a conductive material, such as metal (e.g., copper, aluminum, gold, silver, tungsten, titanium, cobalt, or ruthenium) or alloys thereof, in accordance with some embodiments. The seed layer 131 is formed using a deposition process, such as a physical vapor deposition (PVD) process, a chemical vapor deposition (CVD) process, or an atomic layer deposition (ALD) process, in accordance with some embodiments.

As shown in FIG. 1B, a conductive layer 132 is formed over the seed layer 131, in accordance with some embodiments. The conductive layer 132 is made of a conductive material, such as metal (e.g., copper, aluminum, gold, silver, tungsten, titanium, cobalt, or ruthenium) or alloys thereof, in accordance with some embodiments. The conductive layer 132 is formed by a plating process, such as an electroplating process, in accordance with some embodiments.

Figure 1C:
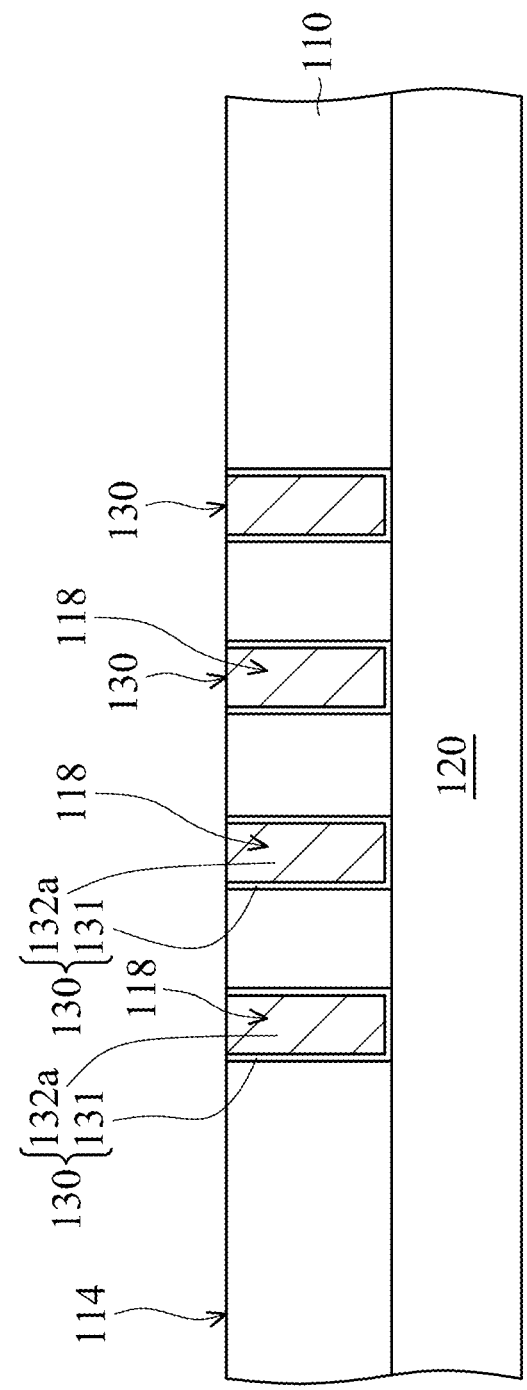

As shown in FIG. 1C, portions of the seed layer 131 and the conductive layer 132 outside of the through holes 118 are removed, in accordance with some embodiments. The conductive layer 132 remaining in one of the through holes 118 forms a conductive pillar 132a, in accordance with some embodiments.

The seed layer 131 remaining in the one of the through holes 118 is between the corresponding conductive pillar 132a and the substrate 110 and between the corresponding conductive pillar 132a and the carrier substrate 120, in accordance with some embodiments. The seed layer 131 remaining in the one of the through holes 118 surrounds the corresponding conductive pillar 132a, in accordance with some embodiments.

The seed layer 131 and the conductive pillar 132a in one of the through holes 118 together form a probe pillar 130, in accordance with some embodiments. The probe pillar 130 is also referred to as a probe needle, in accordance with some embodiments. The entire probe pillar 130 has a substantially straight line shape, in accordance with some embodiments.

The removal process includes a grinding process and/or a planarization process such as a chemical mechanical polishing process, in accordance with some embodiments. The probe pillar 130 has a Young's modulus ranging from about 60 GPa to about 90 GPa, in accordance with some embodiments. The probe pillar 130 has a coefficient of thermal expansion (CTE) ranging from about 10 ppm/° C. to about 20 ppm/° C., in accordance with some embodiments.

Figure 1D:
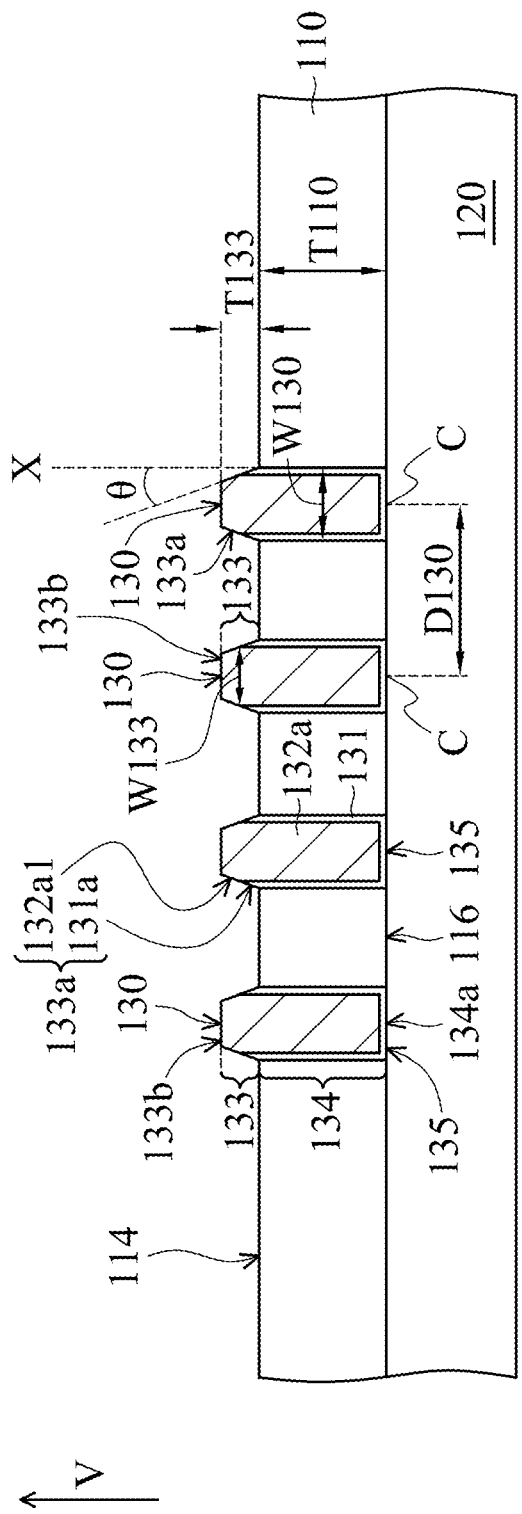

As shown in FIG. 1D, the substrate 110 is partially removed from the surface 114 of the substrate 110, in accordance with some embodiments. The removal process further partially removes the probe pillars 130 adjacent to the surface 114, in accordance with some embodiments. After the removal process, each probe pillar 130 has a protruding portion 133 protruding from the surface 114, in accordance with some embodiments.

The protruding portion 133 has a width W133 decreasing in a direction V away from the carrier substrate 120, in accordance with some embodiments. The protruding portion 133 has a substantially trapezoid shape, in accordance with some embodiments. The protruding portion 133 has sloped sidewalls 133a, in accordance with some embodiments. In some embodiments, an angle θ between the sloped sidewall 133a and a vertical axis X, which is perpendicular to the surface 114, is less than or equal to 10° The angle θ ranges from about 5° to about 100.

In some embodiments, an end surface 131a of the seed layer 131 is substantially level with or coplanar with a sidewall 132a1 of the corresponding conductive pillar 132a. The end surface 131a and the adjacent sidewall 132a1 together form one of the sloped sidewalls 133a, in accordance with some embodiments. Each protruding portion 133 has an end surface 133b, in accordance with some embodiments. The end surfaces 133b are substantially level with or coplanar with each other, in accordance with some embodiments.

The protruding portion 133 has a thickness T133, which is greater than or equal to 10 μm, in accordance with some embodiments. The thickness T133 ranges from about 10 μm to about 50 μm, in accordance with some embodiments. If the thickness T133 is less than 10 μm, the protruding portions 133 may be too short to uniformly contact all of pads of a to-be-tested substrate with warpage, in accordance with some embodiments. The to-be-tested substrate includes a chip, a wafer, a wiring substrate, or the like, in accordance with some embodiments. If the thickness T133 is greater than 50 μm, the protruding portion 133 may be too long to maintain a straight shape, in accordance with some embodiments. In some embodiments, the thickness T133 ranges from about 15 μm to about 45 μm.

In some embodiments, a distance D130 is between centers C of two adjacent probe pillars 130. The distance D130 is also referred to as a pitch, in accordance with some embodiments. The distance D130 is designed according to a pitch of pads of a to-be-tested substrate, in accordance with some embodiments. In some embodiments, the distance D130 ranges from about 20 μm to about 50 μm. In some embodiments, the distance D130 is greater than or equal to 35 μm.

In some embodiments, a width W130 of the probe pillar 130 is greater than or equal to 10 μm. The width W130 ranges from about 20 μm to about 50 μm. The width W130 is also referred to as a diameter of the probe pillar 130, in accordance with some embodiments. The width W130 is designed according to a width of pads of a to-be-tested substrate, in accordance with some embodiments.

The substrate 110 has a thickness T110, which is greater than or equal to 100 μm, in accordance with some embodiments. The thickness T110 ranges from about 100 μm to about 300 μm, in accordance with some embodiments. If the thickness T110 is less than 100 μm, the substrate 110 may be too thin and therefore may be easy to crack, in accordance with some embodiments. If the thickness T110 is greater than 300 μm, the substrate 110 may be too thick to have flexibility, in accordance with some embodiments. The thickness T110 ranges from about 150 μm to about 200 μm, in accordance with some embodiments.

Each probe pillar 130 has an embedded portion 134, which is embedded in the substrate 110, in accordance with some embodiments. The embedded portion 134 has a substantially rectangular shape, in accordance with some embodiments. In some embodiments, an average width of the embedded portion 134 is greater than an average width of the protruding portion 133.

In some embodiments, bottom surfaces 134a of the embedded portions 134 are substantially level with or coplanar with the surface 116 of the substrate 110. Alternatively, end surfaces 135 of the probe pillars 130 are substantially level with or coplanar with the surface 116 of the substrate 110.

Figure 1E:
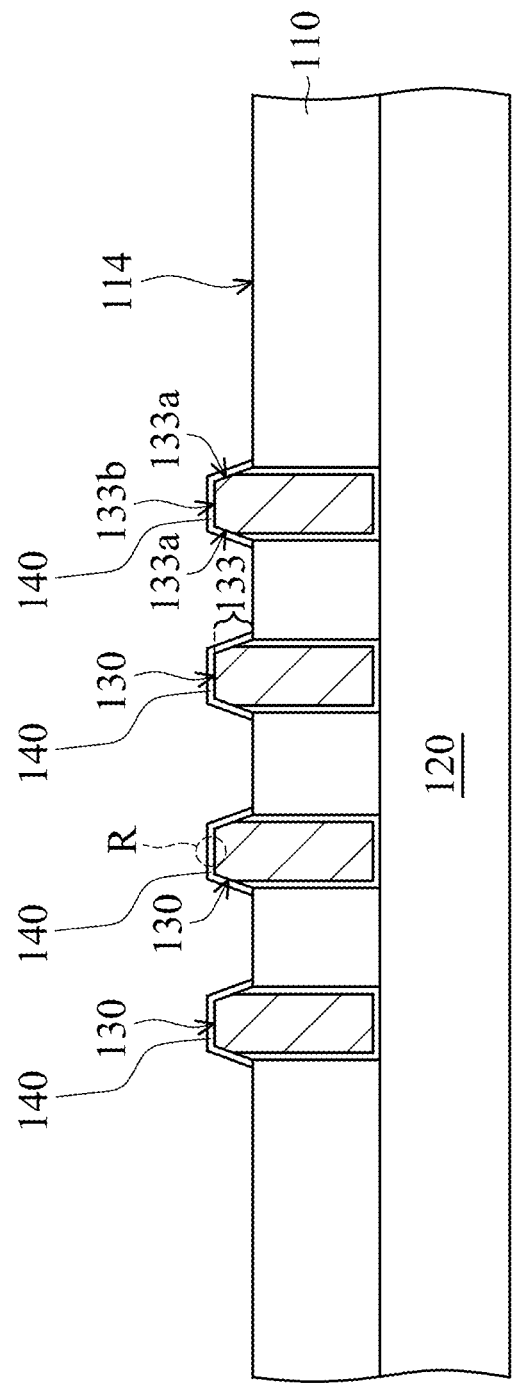
Figures 1, 1E:
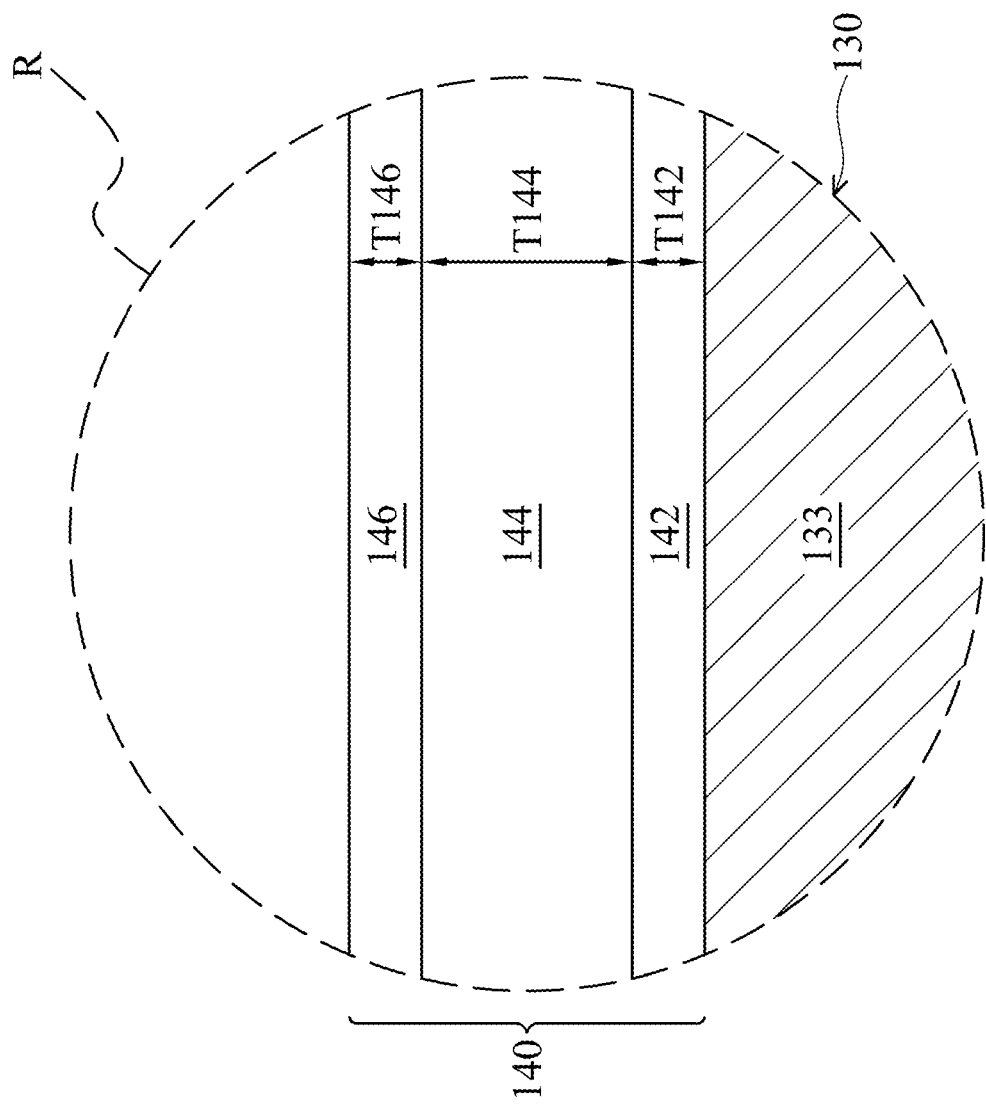

As shown in FIG. 1E, a conductive layer 140 is formed over the protruding portions 133 of the probe pillar 130, in accordance with some embodiments. The conductive layer 140 conformally covers the top surfaces 133b and the sidewalls 133a of the protruding portions 133, in accordance with some embodiments.

FIG. 1E-1 is an enlarged view of the conductive layer 140 in a region R of FIG. 1E, in accordance with some embodiments. As shown in FIGS. 1E and 1E-1, the conductive layer 140 includes a glue layer 142, a barrier layer 144, and a buffer layer 146, in accordance with some embodiments. The glue layer 142, the barrier layer 144, and the buffer layer 146 are sequentially stacked over the protruding portions 133 of the probe pillar 130, in accordance with some embodiments.

The glue layer 142 is made of a conductive material with a good adhesion to the protruding portions 133 and the barrier layer 144, such as titanium or alloys thereof, in accordance with some embodiments. In some embodiments, a thickness T142 ranges from about 0.1 μm to about 0.6 μm. The glue layer 142 is formed using a selective plating process, such as a selective electroless plating process (e.g., a chemical plating process), in accordance with some embodiments.

The barrier layer 144 is able to reduce or prevent electromigration effects and oxidation of the protruding portions 133, in accordance with some embodiments. The barrier layer 144 is made of a conductive material, which is able to reduce or prevent electromigration effects and oxidation of the protruding portions 133, such as nickel, in accordance with some embodiments.

In some embodiments, a thickness T144 ranges from about 1 μm to about 3 μm. The thickness T144 is greater than the thickness T142, in accordance with some embodiments. The barrier layer 144 is formed using a selective plating process, such as a selective electroless plating process (e.g., a chemical plating process), in accordance with some embodiments.

The buffer layer 146 is able to buffer the contact stress during a subsequent circuit probing test process so as to protect to-be-tested pads from damage caused by the contact stress, in accordance with some embodiments. The circuit probing test process includes a wafer-level testing process, in accordance with some embodiments. The buffer layer 146 is made of a soft conductive material with good conductivity and stable chemical and physical properties, such as gold, in accordance with some embodiments.

In some embodiments, a thickness T146 ranges from about 0.1 μm to about 0.9 μm. The buffer layer 146 is formed using a selective plating process, such as a selective electroless plating process (e.g., a chemical plating process), in accordance with some embodiments.

Figure 1F:
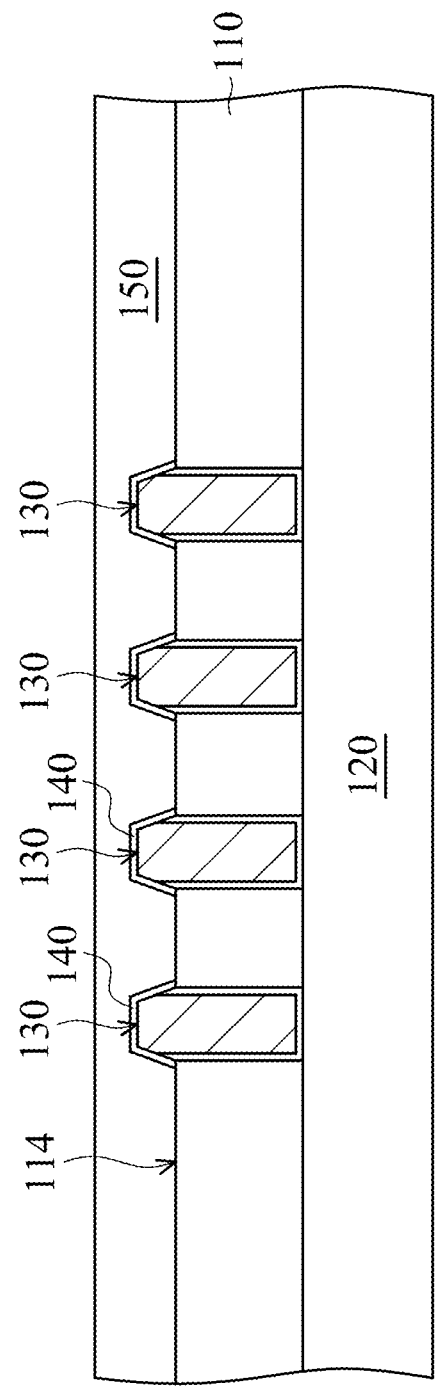

As shown in FIG. 1F, a protective film 150 is formed over the conductive layer 140 and the surface 114 of the substrate 110, in accordance with some embodiments. The protective film 150 includes a tape, in accordance with some embodiments. The protective film 150 is used to protect the conductive layer 140 and the surface 114 of the substrate 110 from damage during subsequent processes, in accordance with some embodiments. The protective film 150 is made of a soft insulating material, such as a polymer material, in accordance with some embodiments.

Figure 1G:
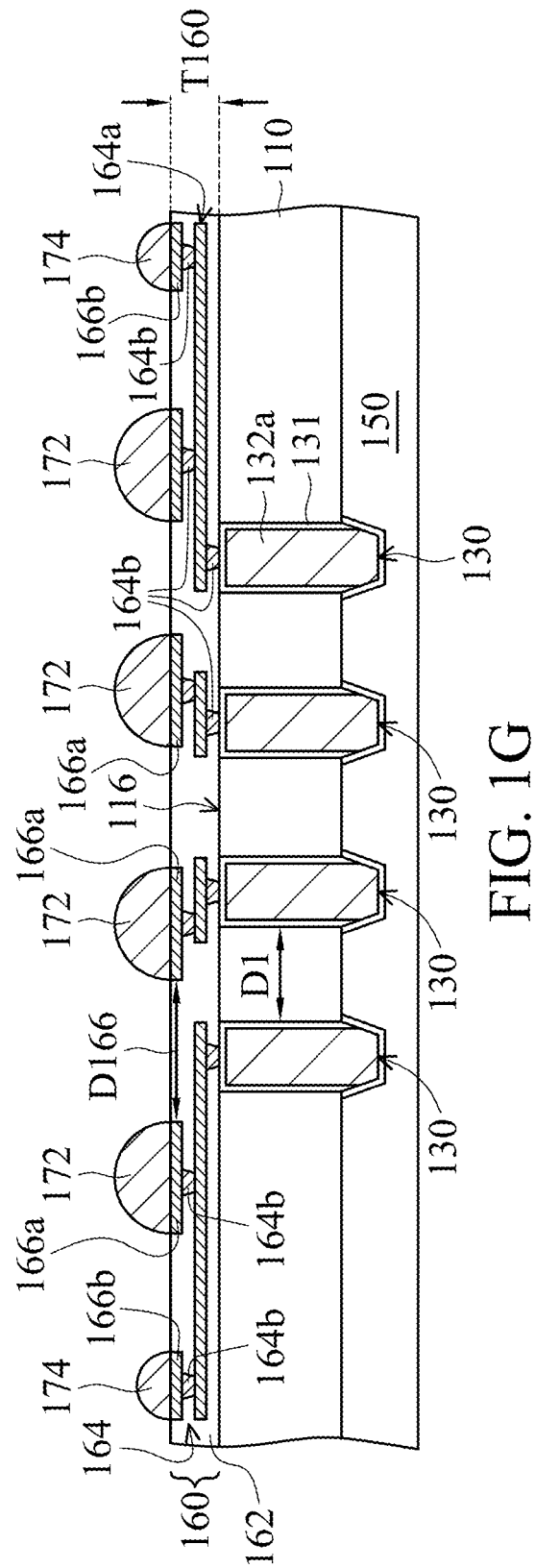

As shown in FIG. 1G, the substrate 110 is flipped over, in accordance with some embodiments. As shown in FIG. 1G, a redistribution structure 160 is formed over the probe pillars 130 and the surface 116 of the substrate 110, in accordance with some embodiments. The redistribution structure 160 is also referred to as an organic interposer structure, in accordance with some embodiments.

The redistribution structure 160 is in direct contact with the substrate 110 and the probe pillars 130, in accordance with some embodiments. The seed layer 131 is between the conductive pillar 132a and the redistribution structure 160, in accordance with some embodiments.

The redistribution structure 160 is softer than the substrate 110 and the probe pillars 130, in accordance with some embodiments. The redistribution structure 160 is used to buffer the contact stress from the probe pillars 130 during a subsequent circuit probing test process, in accordance with some embodiments. The circuit probing test process includes a wafer-level testing process, in accordance with some embodiments.

The redistribution structure 160 has a Young's modulus ranging from about 2 GPa to about 5 GPa, in accordance with some embodiments. The Young's modulus of the redistribution structure 160 is less than the Young's modulus of the substrate 110, in accordance with some embodiments.

The redistribution structure 160 has a coefficient of thermal expansion (CTE) ranging from about 20 ppm/° C. to about 50 ppm/° C., in accordance with some embodiments. The redistribution structure 160 is thinner than the substrate 110, in accordance with some embodiments. The redistribution structure 160 has a thickness T160 ranging from about 5 μm to about 20 μm, in accordance with some embodiments.

The redistribution structure 160 includes a dielectric structure 162, a wiring structure 164, and conductive pads 166a and 166b, in accordance with some embodiments. The dielectric structure 162 is formed over the probe pillars 130 and the surface 116 of the substrate 110, in accordance with some embodiments. The wiring structure 164 and the conductive pads 166a and 166b are formed in the dielectric structure 162, in accordance with some embodiments. The wiring structure 164 and the conductive pads 166a and 166b are electrically connected to the probe pillars 130, in accordance with some embodiments.

The redistribution structure 160 is used as a fan-out redistribution structure, in accordance with some embodiments. In some embodiments, a distance D166 between the conductive pads 166a is greater than a distance D1 between two adjacent probe pillars 130. The distance D1 ranges from about 20 μm to about 50 μm, in accordance with some embodiments. The distance D166 ranges from about 100 μm to about 200 μm, in accordance with some embodiments.

The wiring structure 164 includes wiring layers 164a and conductive vias 164b, in accordance with some embodiments. For the sake of simplicity, FIG. 1G only shows one of the wiring layers 164a, in accordance with some embodiments. The conductive vias 164b are electrically connected between different wiring layers 164a, between the wiring layer 164a and the probe pillars 130, and between the wiring layer 164a and the conductive pads 166a and 166b, in accordance with some embodiments. The conductive pad 166a is wider than the conductive pad 166b, in accordance with some embodiments.

The dielectric structure 162 is made of an oxide-containing material (e.g. silicon oxide or undoped silicate glass) or another suitable insulating material, in accordance with some embodiments. The wiring structure 164 and the conductive pads 166a and 166b are made of conductive materials such as metal (e.g., aluminum, copper or tungsten) or alloys thereof, in accordance with some embodiments.

As shown in FIG. 1G, conductive bumps 172 and 174 are formed over the conductive pads 166a and 166b respectively, in accordance with some embodiments. The conductive bump 172 is greater than the conductive bump 174, in accordance with some embodiments. That is, the conductive bump 172 is wider than the conductive bump 174, in accordance with some embodiments. The conductive bump 172 is thicker than the conductive bump 174, in accordance with some embodiments.

The conductive bumps 172 and 174 are made of a conductive material, such as metal (e.g., tin or the like) or alloys thereof, in accordance with some embodiments. The conductive bumps 172 and 174 are formed using a plating process, such as an electroplating process, and a reflow process, in accordance with some embodiments. In some other embodiments, the conductive bumps 172 and 174 are formed using a ball mount process and a reflow process.

Figure 1H:
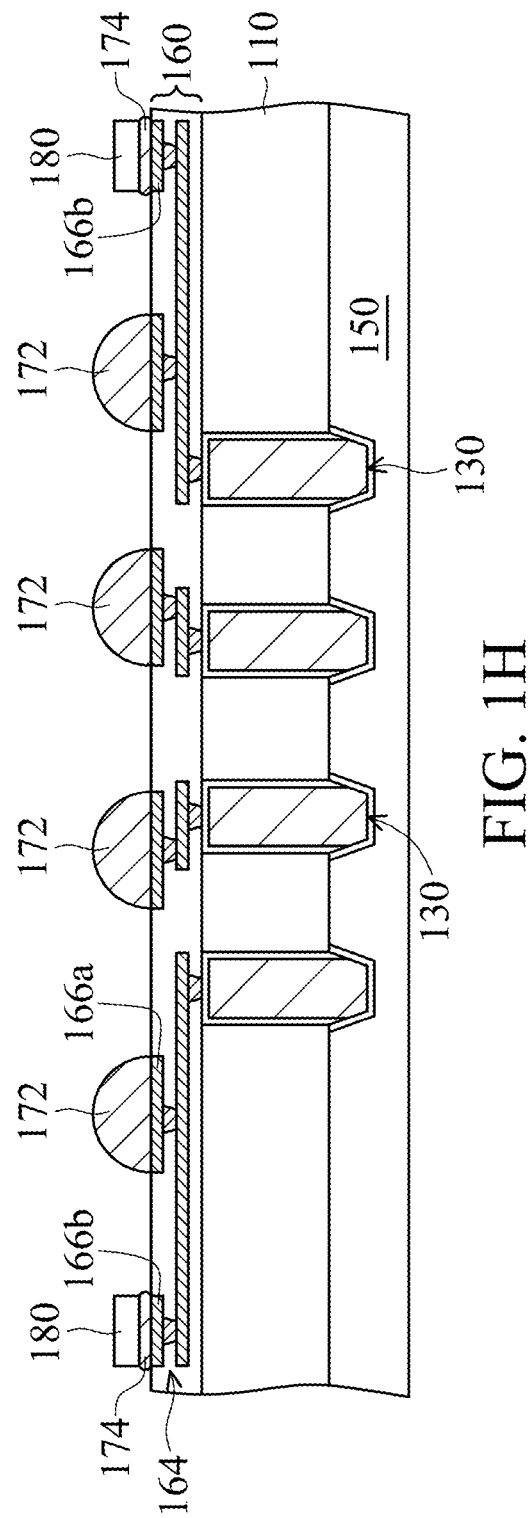

As shown in FIG. 1H, devices 180 are bonded with the conductive pads 166b through the conductive bumps 174, in accordance with some embodiments. The devices 180 are electrically connected to the probe pillars 130 through the conductive bumps 174, the conductive pads 166b, and the wiring structure 164, in accordance with some embodiments. The devices 180 include passive devices, such as capacitors, resistors, inductors, or active devices, in accordance with some embodiments.

Figure 1I:
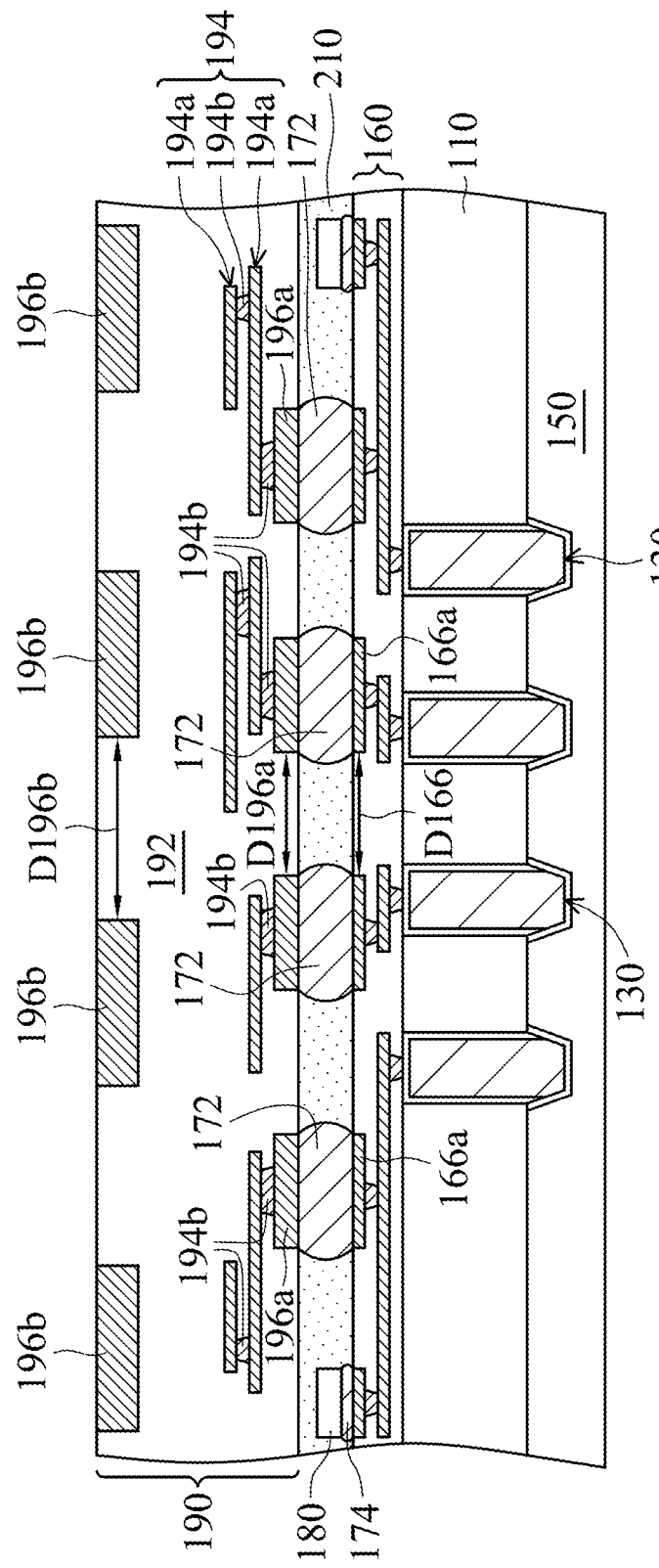

As shown in FIG. 1I, a wiring substrate 190 is bonded to the redistribution structure 160 through the conductive bumps 172, in accordance with some embodiments. The wiring substrate 190 includes a dielectric structure 192, a wiring structure 194, and conductive pads 196a and 196b, in accordance with some embodiments.

The wiring structure 194 and the conductive pads 196a and 196b are formed in the dielectric structure 192, in accordance with some embodiments. The wiring structure 194 and the conductive pads 196a and 196b are electrically connected to the probe pillars 130 through the conductive bumps 172 and the redistribution structure 160, in accordance with some embodiments.

The wiring substrate 190 is used as a fan-out wiring substrate, in accordance with some embodiments. In some embodiments, a distance D196b between the conductive pads 196b is greater than a distance D196a between the conductive pads 196a. The distance D196b is greater than the distance D166 between the conductive pads 166a, in accordance with some embodiments. The distance D196a is substantially equal to the distance D166, in accordance with some embodiments. The distance D196b ranges from about 0.5 mm to about 1.5 mm, in accordance with some embodiments.

The wiring structure 194 includes wiring layers 194a and conductive vias 194b, in accordance with some embodiments. The conductive vias 194b are electrically connected between different wiring layers 194a, between the wiring layer 194a and the conductive pads 196a, and between the wiring layer 194a and the conductive pads 196b, in accordance with some embodiments. The conductive pad 196*b* is wider than the conductive pad 196*a*, in accordance with some embodiments.

The dielectric structure 192 is made of an insulating material such as a polymer material or glass fibers, in accordance with some embodiments. The wiring structure 194 and the conductive pads 196*a* and 196*b* are made of conductive materials such as metal (e.g., aluminum, copper or tungsten) or alloys thereof, in accordance with some embodiments.

As shown in FIG. 1I, an underfill layer 210 is formed between the wiring substrate 190 and the redistribution structure 160, in accordance with some embodiments. The underfill layer 210 surrounds the devices 180 and the conductive bumps 172 and 174, in accordance with some embodiments. The underfill layer 210 is made of an insulating material, such as a polymer material, in accordance with some embodiments.

Figure 1J:
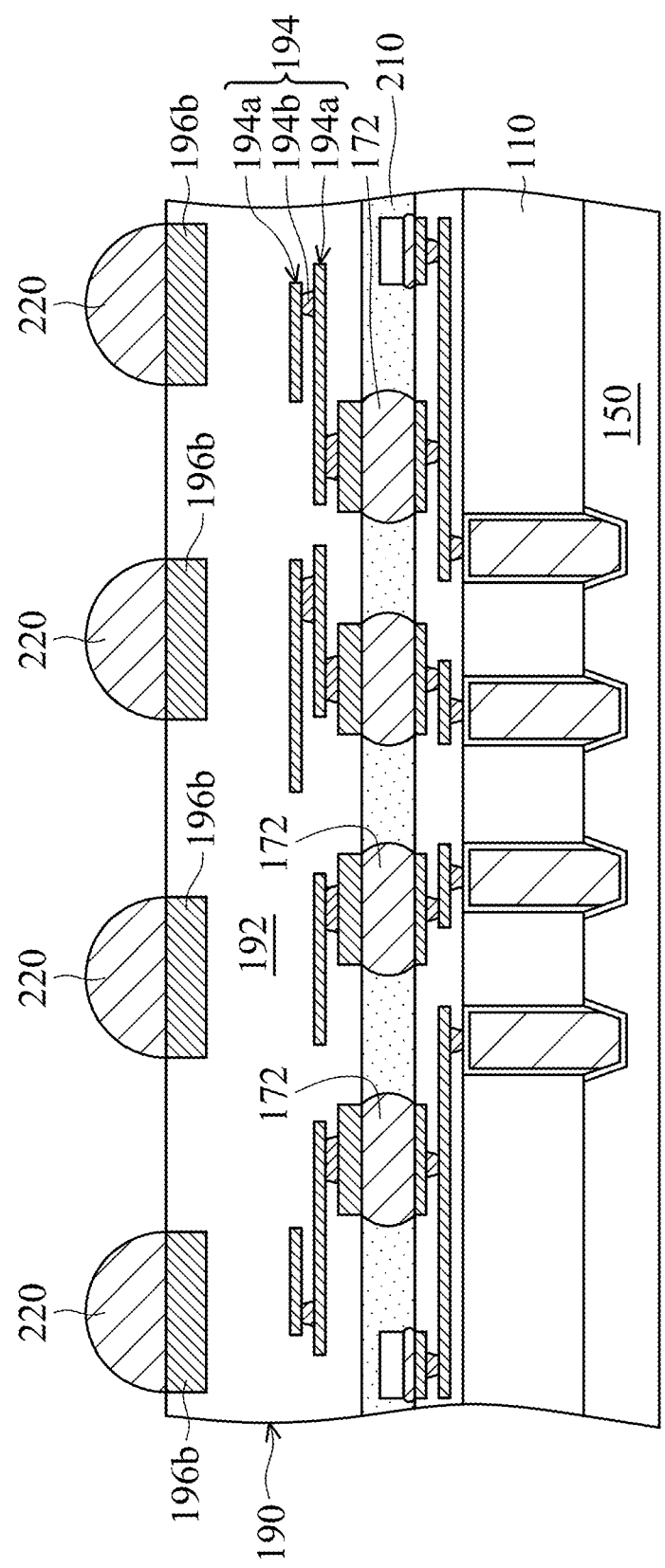

As shown in FIG. 1J, conductive bumps 220 are formed over the conductive pads 196*b* respectively, in accordance with some embodiments. The conductive bump 220 is greater than the conductive bump 172, in accordance with some embodiments. That is, the conductive bump 220 is wider than the conductive bump 172, in accordance with some embodiments. The conductive bump 220 is thicker than the conductive bump 172, in accordance with some embodiments.

The conductive bumps 220 are made of a conductive material, such as metal (e.g., tin or the like) or alloys thereof, in accordance with some embodiments. The conductive bumps 220 are formed using a plating process, such as an electroplating process, and a reflow process, in accordance with some embodiments. In some other embodiments, the conductive bumps 220 are formed using a ball mount process and a reflow process.

Figure 1K:
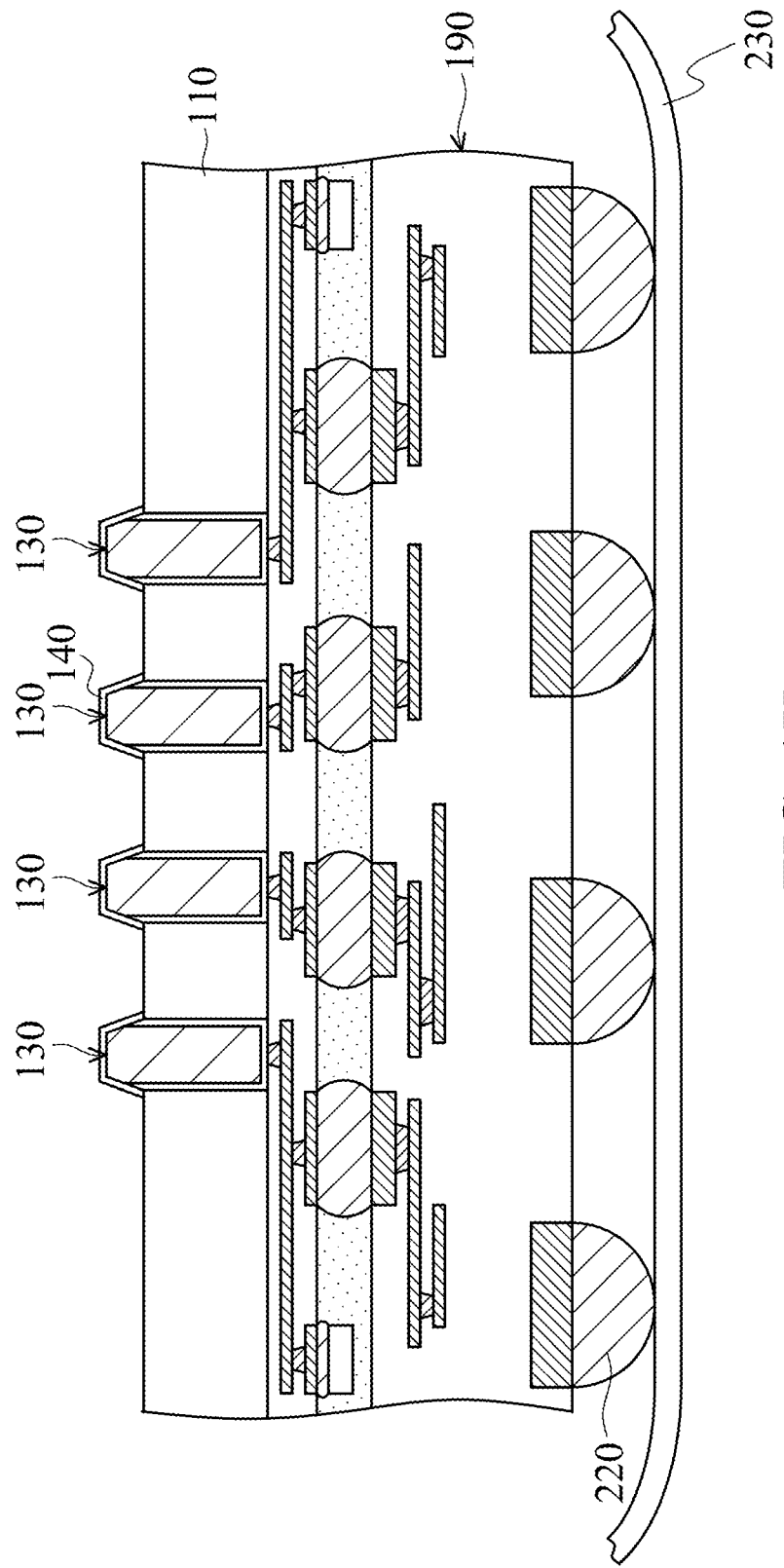

As shown in FIG. 1K, the wiring substrate 190 is flipped over and disposed over a carrier 230, in accordance with some embodiments. The carrier 230 includes a tape, in accordance with some embodiments. The carrier 230 is made of a flexible material, such as a polymer material, in accordance with some embodiments. Thereafter, as shown in FIG. 1K, the protective film 150 is removed, in accordance with some embodiments.

Figure 1L:
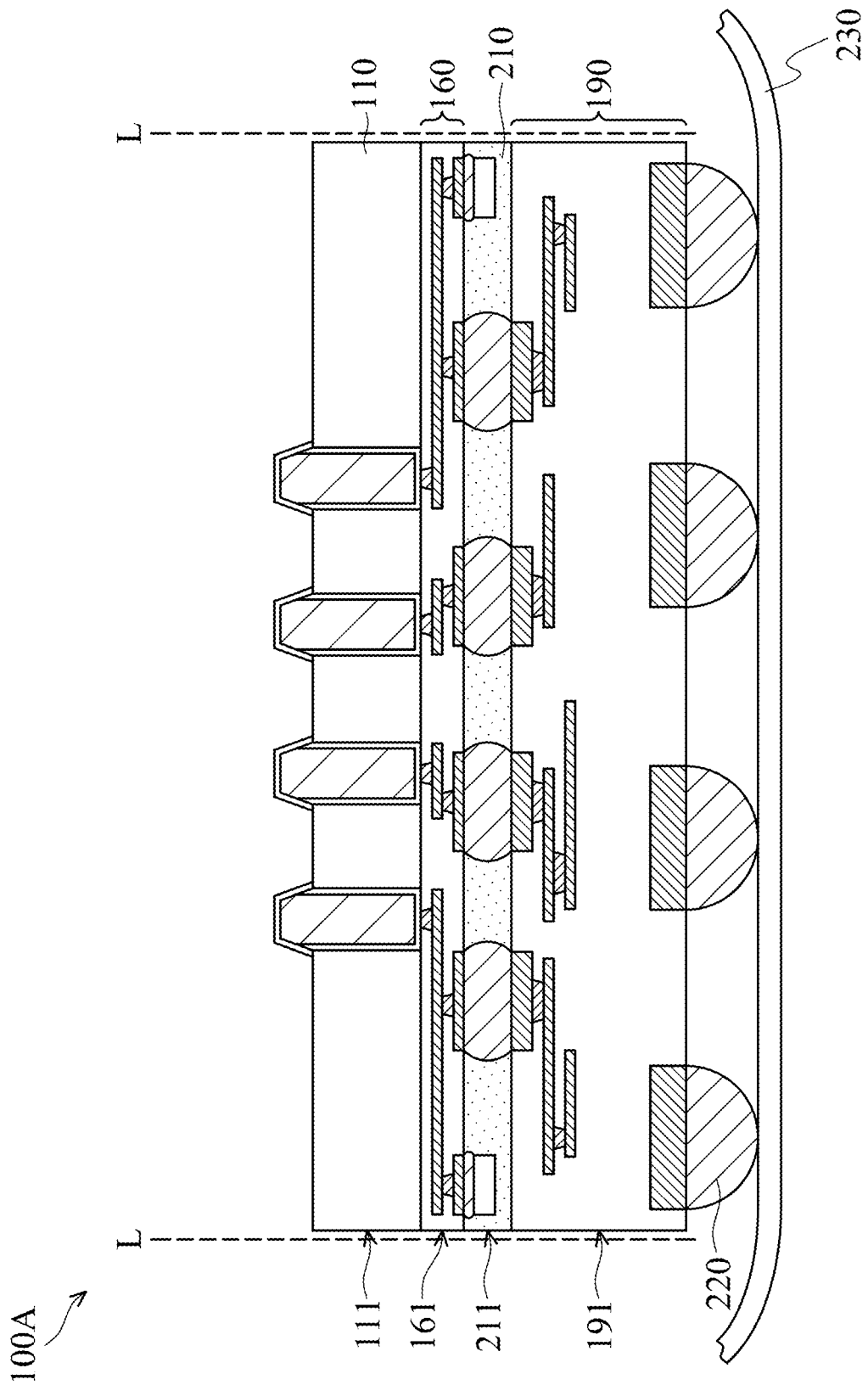

As shown in FIG. 1L, a cutting process is performed to cut through the substrate 110, the redistribution structure 160, the underfill layer 210, and the wiring substrate 190 along cutting lines L to form probe-head elements 100A, in accordance with some embodiments. For the sake of simplicity, FIG. 1L only shows one of the probe-head elements 100A, in accordance with some embodiments. The cutting process is also referred to as a sawing process or a singulation process, in accordance with some embodiments.

In some embodiments, sidewalls 111, 161, 211, and 191 of the substrate 110, the redistribution structure 160, the underfill layer 210, and the wiring substrate 190 are substantially level with or coplanar with each other. The substrate 110, the redistribution structure 160, the underfill layer 210, and the wiring substrate 190 all have the same width, in accordance with some embodiments.

Figure 1M:
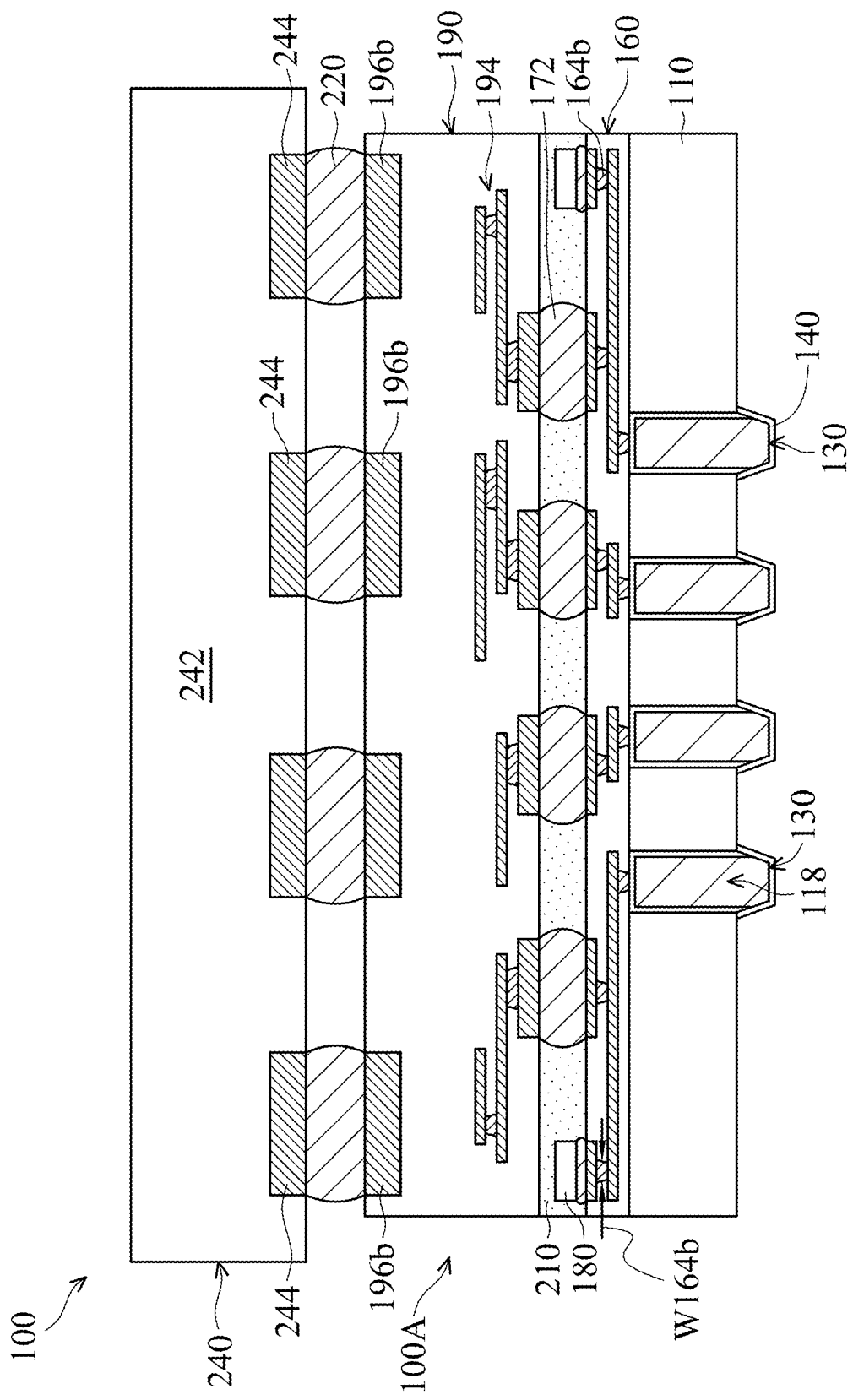

As shown in FIG. 1M, the carrier 230 is removed, in accordance with some embodiments. As shown in FIG. 1M, the wiring substrate 190 is flipped over, in accordance with some embodiments. As shown in FIG. 1M, a circuit board 240 is bonded to the wiring substrate 190 through the conductive bumps 220, in accordance with some embodiments. In this step, a probe head structure 100 is substantially formed, in accordance with some embodiments.

The circuit board 240 includes a dielectric structure 242, a wiring structure (not shown), and conductive pads 244, in accordance with some embodiments. The wiring structure and the conductive pads 244 are formed in the dielectric structure 242, in accordance with some embodiments.

The wiring structure and the conductive pads 244 are electrically connected to the probe pillars 130 through the conductive bumps 220, the wiring substrate 190, the conductive bumps 172, and the redistribution structure 160, in accordance with some embodiments. The wiring structure includes wiring layers and conductive vias, in accordance with some embodiments. The conductive vias are electrically connected between different wiring layers and between the wiring layer and the conductive pads 244, in accordance with some embodiments.

The dielectric structure 242 is made of an insulating material such as a polymer material or glass fibers, in accordance with some embodiments. The wiring structure and the conductive pads 244 are made of conductive materials such as metal (e.g., aluminum, copper or tungsten) or alloys thereof, in accordance with some embodiments. The conductive via 164*b* of the redistribution structure 160 has a width W164*b* decreasing toward the substrate 110, in accordance with some embodiments.

Since the probe pillars 130 are formed by performing a plating process in the through holes 118 of the substrate 110, the width of the probe pillars 130 and the distance between two adjacent probe pillars 130 are determined by the through holes 118, in accordance with some embodiments. The through holes 118 are formed by an etching process (e.g., a dry etching process) or a drilling process (e.g., a laser drilling process), which is able to form through holes with a small width and a fine pitch (e.g., less than 60 μm), in accordance with some embodiments. Therefore, the probe pillars 130 have a small width and a fine pitch, and the probe head structure 100 is able to be used to test a to-be-tested substrate with small-width and fine-pitch pads during a circuit probing test process, in accordance with some embodiments. The circuit probing test process includes a wafer-level testing process, in accordance with some embodiments.

Since the redistribution structure 160 is formed over the substrate 110, the device 180 is able to be formed over the substrate 110 through bonding with the redistribution structure 160, which shortens the length of the conductive path between the devices 180 and the probe pillars 130 as compared with forming the devices 180 over the wiring substrate 190, in accordance with some embodiments.

In some embodiments, the devices 180 are capacitors, and the devices 180 are able to maintain the integrity of the testing signal from the probe pillars 130 during a subsequent circuit probing test process. The circuit probing test process includes a wafer-level testing process, in accordance with some embodiments. If the length of the conductive path between the devices 180 and the probe pillars 130 is reduced, the reduction amount of the testing signal from the probe pillars 130 to the devices 180 is reduced, in accordance with some embodiments. Therefore, the integrity of the testing signal from the probe pillars 130 to the devices 180 is improved, which improves the accuracy of the circuit probing test processes using the probe head structure 100, in accordance with some embodiments. As a result, the electrical performance of the probe head structure 100 is improved, in accordance with some embodiments.

Since the average distance between the probe pillars 130 is greatly less than the average distance between the conductive pads 244 of the circuit board 240, it needs fan-out wiring layers to electrically connect the probe pillars 130 to the conductive pads 244, in accordance with some embodiments. The formation of the redistribution structure 160 may reduce the number of the wiring layers of the wiring substrate 190, which reduces the thickness and the manufacturing cost of the wiring substrate 190, in accordance with some embodiments.

The reduction amount of the manufacturing cost of the wiring substrate 190 is greater the manufacturing cost of the redistribution structure 160, and therefore the manufacturing cost of the probe head structure 100 is reduced, in accordance with some embodiments.

The reduction of the wiring layers of the wiring substrate 190 may reduce the difficulty of manufacturing the wiring substrate 190 and the manufacturing time of the wiring substrate 190, in accordance with some embodiments. The manufacturing time is also referred to as a leading time, in accordance with some embodiments.

Figure 2:
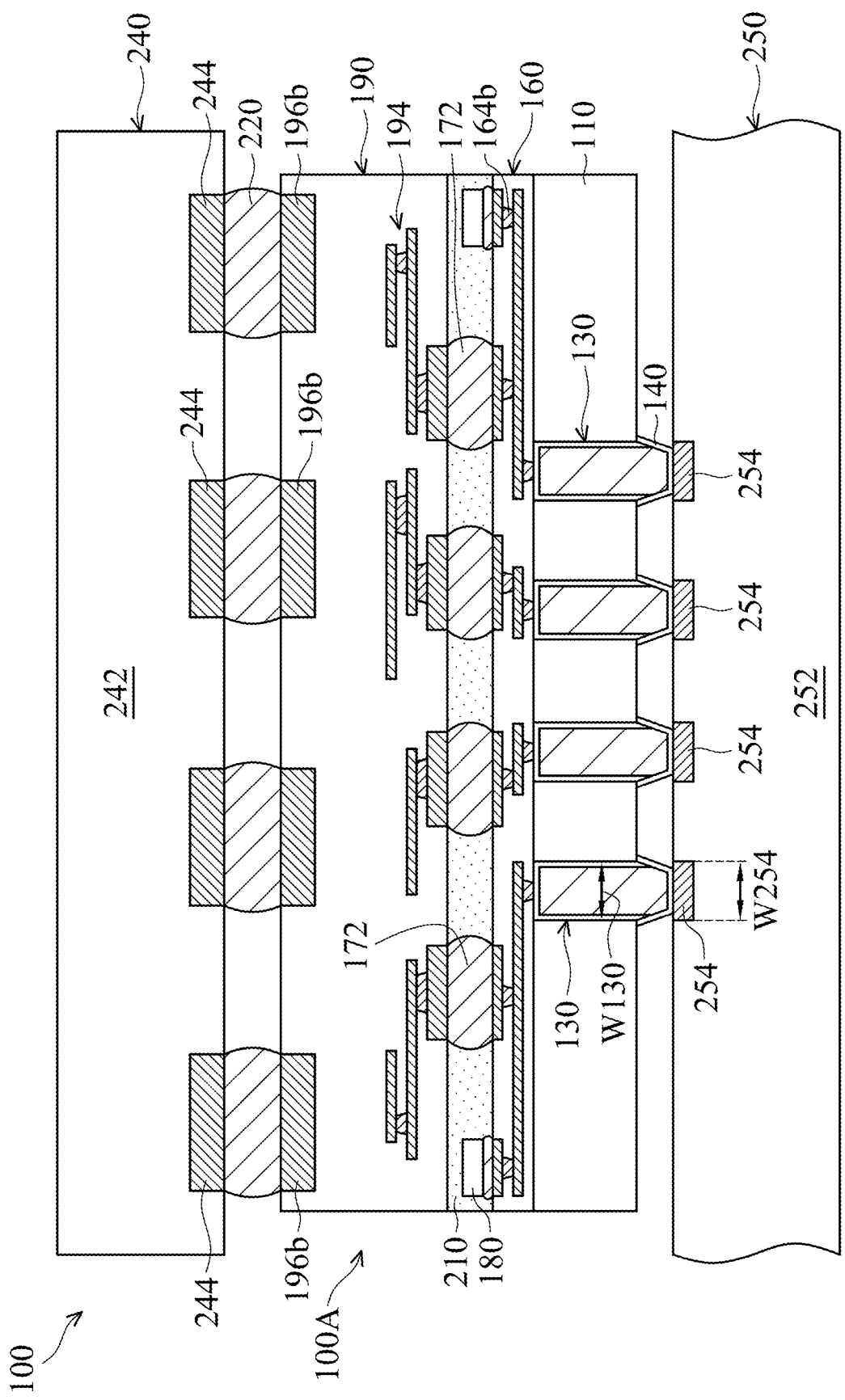
FIG. 2 is a cross-sectional view of a probe head structure and a to-be-tested substrate, in accordance with some embodiments.

FIG. 2 is a cross-sectional view of a probe head structure 100 and a to-be-tested substrate 250, such as a wafer with integrated circuits, in accordance with some embodiments. As shown in FIG. 2, a to-be-tested substrate 250 is provided, in accordance with some embodiments. The to-be-tested substrate 250 includes a chip, a wafer, or a wiring substrate, in accordance with some embodiments. The to-be-tested substrate 250 includes a main portion 252, a wiring structure (not shown), and conductive pads 254, in accordance with some embodiments.

The main portion 252 includes a substrate (not shown) and a dielectric structure (not shown) over the substrate, in accordance with some embodiments. The substrate is made of an elementary semiconductor material including silicon or germanium in a single crystal structure, a polycrystal structure, or an amorphous structure. In some other embodiments, the substrate is made of a compound semiconductor, such as silicon carbide, gallium arsenide, gallium phosphide, indium phosphide, indium arsenide, an alloy semiconductor, such as SiGe or GaAsP, or a combination thereof. The substrate may also include multi-layer semiconductors, semiconductor on insulator (SOI) (such as silicon on insulator or germanium on insulator), or a combination thereof.

In some embodiments, the substrate is a device wafer that includes various device elements. In some embodiments, the various device elements are formed in and/or over the substrate. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate. The isolation features are used to surround active regions and electrically isolate various device elements formed in and/or over the substrate in the active regions. In some embodiments, the isolation features include shallow trench isolation (STI) features, local oxidation of silicon (LOCOS) features, other suitable isolation features, or a combination thereof.

The dielectric structure is made of an insulating material such as an oxide material (e.g., silicon oxide), a nitride material (e.g., silicon nitride), a polymer material, or glass fibers, in accordance with some embodiments.

The wiring structure and the conductive pads 254 are formed in the dielectric structure of the main portion 252, in accordance with some embodiments. The wiring structure includes wiring layers and conductive vias, in accordance with some embodiments. The conductive vias are electrically connected between different wiring layers and between the wiring layer and the conductive pads 254, in accordance with some embodiments. The wiring structure and the conductive pads 254 are made of conductive materials such as metal (e.g., aluminum, copper or tungsten) or alloys thereof, in accordance with some embodiments.

As shown in FIG. 2, a circuit probing test process is performed over the to-be-tested substrate 250 using the probe head structure 100, in accordance with some embodiments. The circuit probing test process includes a wafer-level testing process, in accordance with some embodiments. The probe head structure 100 is positioned over the to-be-tested substrate 250, in accordance with some embodiments. The probe pillars 130 are in direct contact with the conductive pads 254 to check electrical performance or sorting, in accordance with some embodiments. In some embodiments, a width W254 of the conductive pad 254 is substantially equal to a width W130 of the probe pillar 130.

Figure 3:
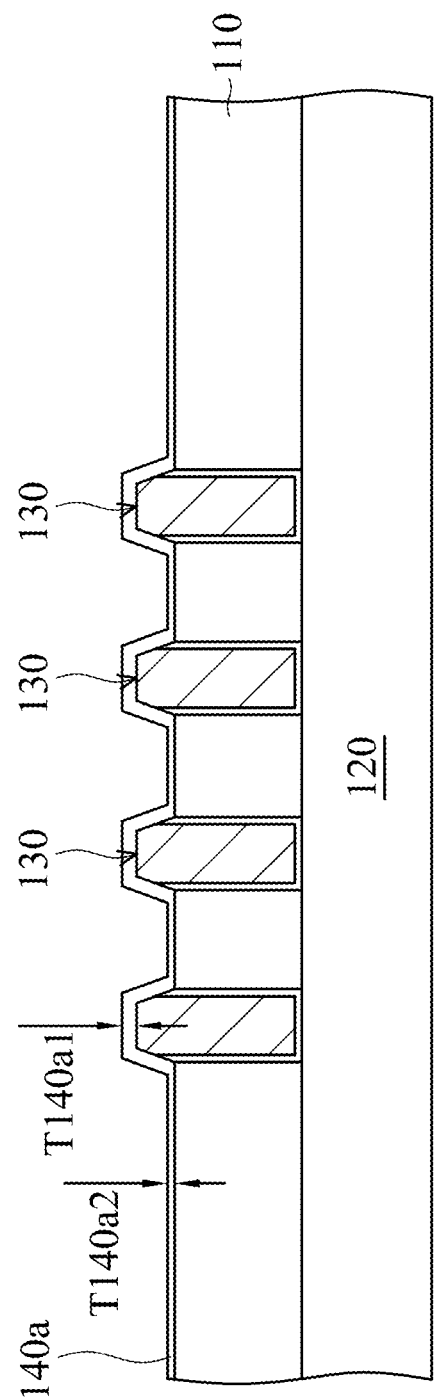
FIG. 3 is a cross-sectional view of a stage of a process for forming a probe head structure, in accordance with some embodiments.

FIG. 3 is a cross-sectional view of a stage of a process for forming a probe head structure, in accordance with some embodiments. As shown in FIG. 3, after the step of FIG. 1D, a conductive layer 140a is deposited over the probe pillars 130 and the substrate 110, in accordance with some embodiments.

The conductive layer 140a conformally covers the probe pillars 130 and the substrate 110, in accordance with some embodiments. The conductive layer 140a is formed using a deposition process, such as a physical vapor deposition process or a chemical vapor deposition process, in accordance with some embodiments.

Since the materials of the probe pillars 130 and the substrate 110 are different, the surface properties of the probe pillars 130 and the substrate 110 are different, in accordance with some embodiments. Therefore, the conductive layer 140a over the probe pillars 130 is thicker than the conductive layer 140a over the substrate 110, in accordance with some embodiments. That is, a thickness T140a1 of the conductive layer 140a over the probe pillars 130 is greater than a thickness T140a2 of the conductive layer 140a over the substrate 110, in accordance with some embodiments.

Thereafter, as shown in FIG. 1E, a thinning process is performed over the conductive layer 140a until the surface 114 of the substrate 110 is exposed, in accordance with some embodiments. The remaining conductive layer 140a forms the conductive layer 140 over the probe pillars 130, in accordance with some embodiments. The thinning process includes an etching process, such as a dry etching process or a wet etching process, in accordance with some embodiments.

Figure 4A:
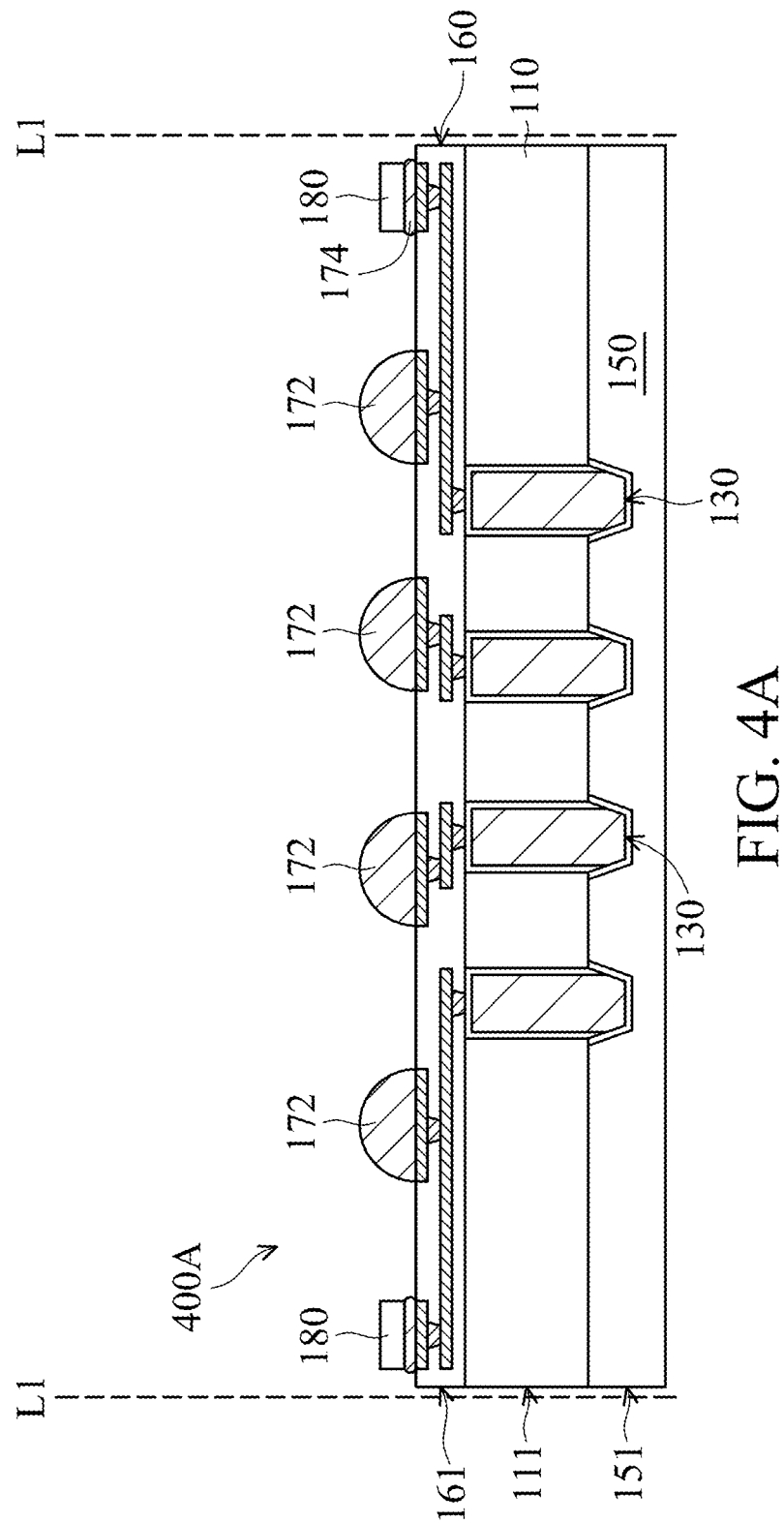
FIGS. 4A-4D are cross-sectional views of various stages of a process for forming a probe head structure, in accordance with some embodiments.

FIGS. 4A-4D are cross-sectional views of various stages of a process for forming a probe head structure, in accordance with some embodiments. As shown in FIG. 4A, after the step of FIG. 1H, a cutting process is performed to cut through the redistribution structure 160, the substrate 110, and the protective film 150 along cutting lines L1 to form probe-head components 400A, in accordance with some embodiments.

For the sake of simplicity, FIG. 4A only shows one of the probe-head components 400A, in accordance with some embodiments. The cutting process is also referred to as a sawing process or a singulation process, in accordance with some embodiments.

In some embodiments, sidewalls 111, 161, and 151 of the substrate 110, the redistribution structure 160, and the protective film 150 are substantially level with or coplanar with each other. The substrate 110, the redistribution structure 160, and the protective film 150 all have the same width, in accordance with some embodiments.

Figure 4B:
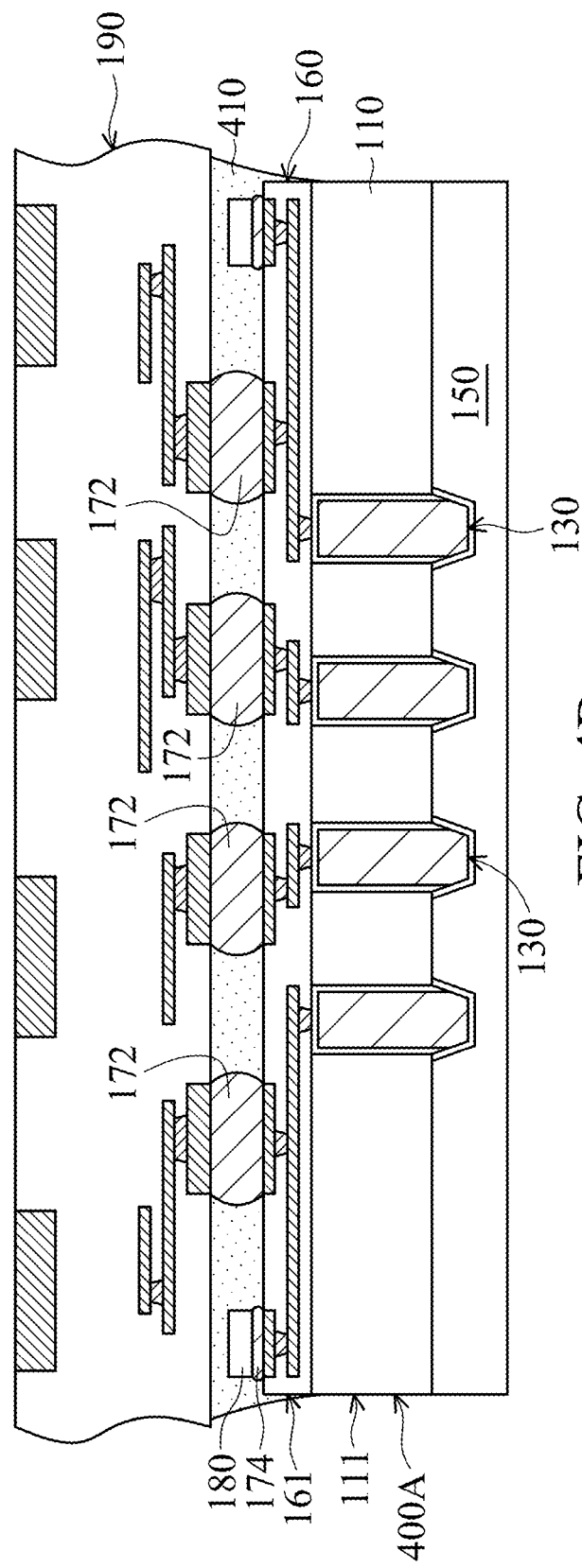

Thereafter, as shown in FIG. 4B, the step of FIG. 1I is performed to bond the wiring substrate 190 to the redistribution structure 160 through the conductive bumps 172, in accordance with some embodiments. Afterwards, as shown in FIG. 4B, an underfill layer 410 is formed between the wiring substrate 190 and the redistribution structure 160, in accordance with some embodiments.

The underfill layer 410 surrounds the devices 180, the conductive bumps 172 and 174, the redistribution structure 160, and the substrate 110, in accordance with some embodiments. The underfill layer 410 is made of an insulating material, such as a polymer material, in accordance with some embodiments.

Figure 4C:
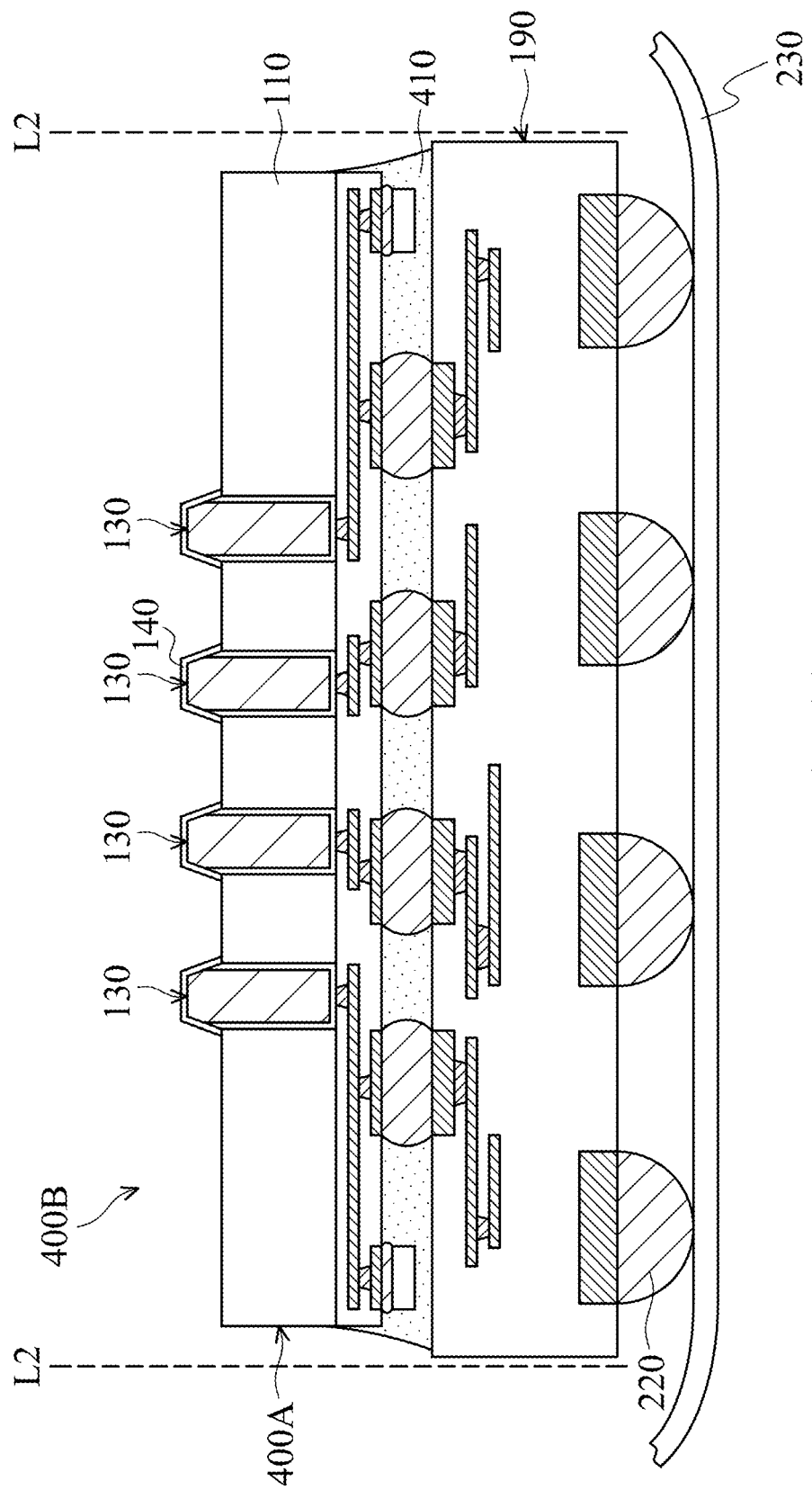

Thereafter, as shown in FIG. 4C, the steps of FIGS. 1J and 1K are performed, and a cutting process is performed to cut through the wiring substrate 190 along cutting lines L2 to form probe-head elements 400B, in accordance with some embodiments. For the sake of simplicity, FIG. 4C only shows one of the probe-head elements 400B, in accordance with some embodiments.

Figure 4D:
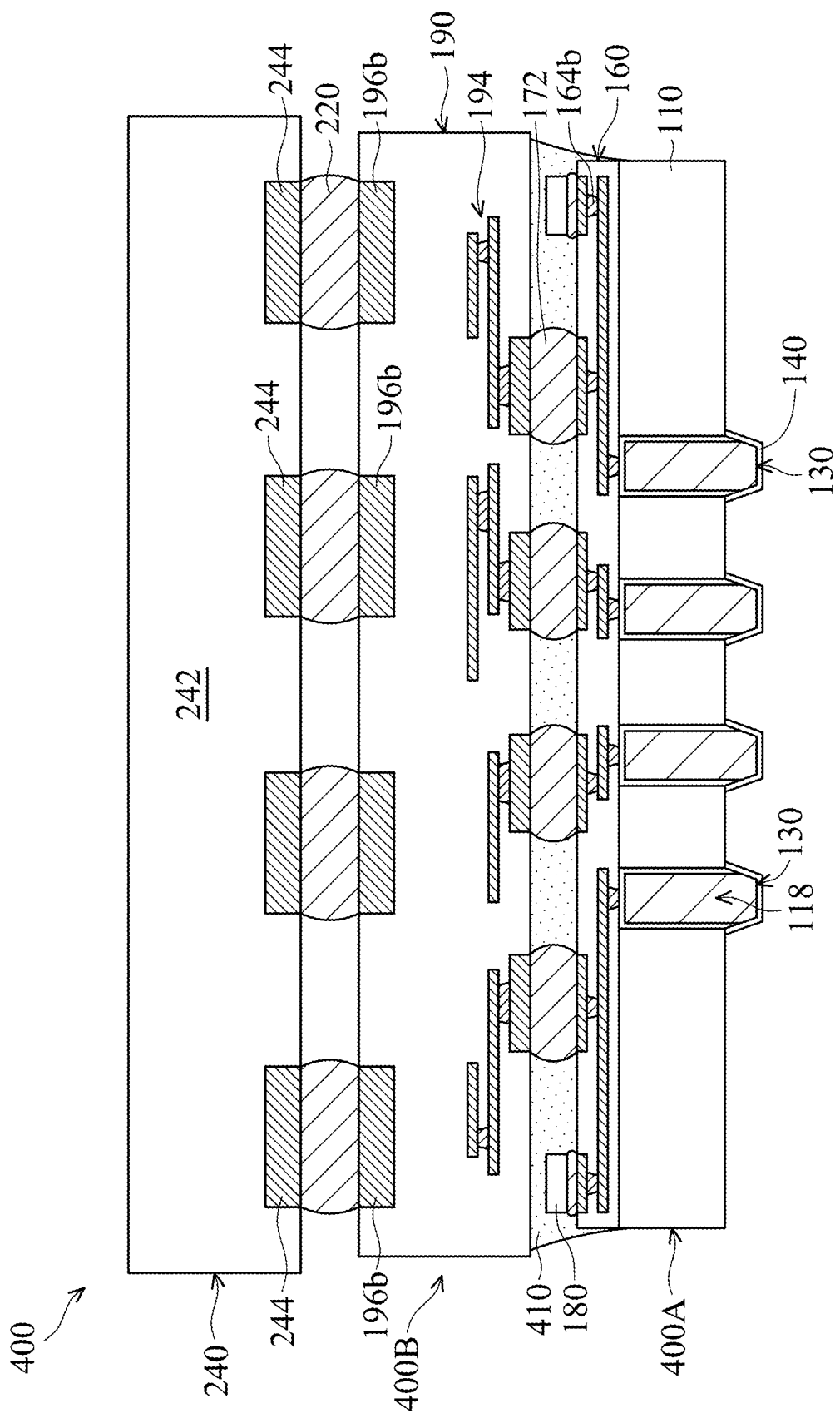

As shown in FIG. 4D, the step of FIG. 1M is performed to remove the carrier 230 and to bond the circuit board 240 to the wiring substrate 190 through the conductive bumps 220, in accordance with some embodiments. In this step, a probe head structure 400 is substantially formed, in accordance with some embodiments.

Figure 5A:
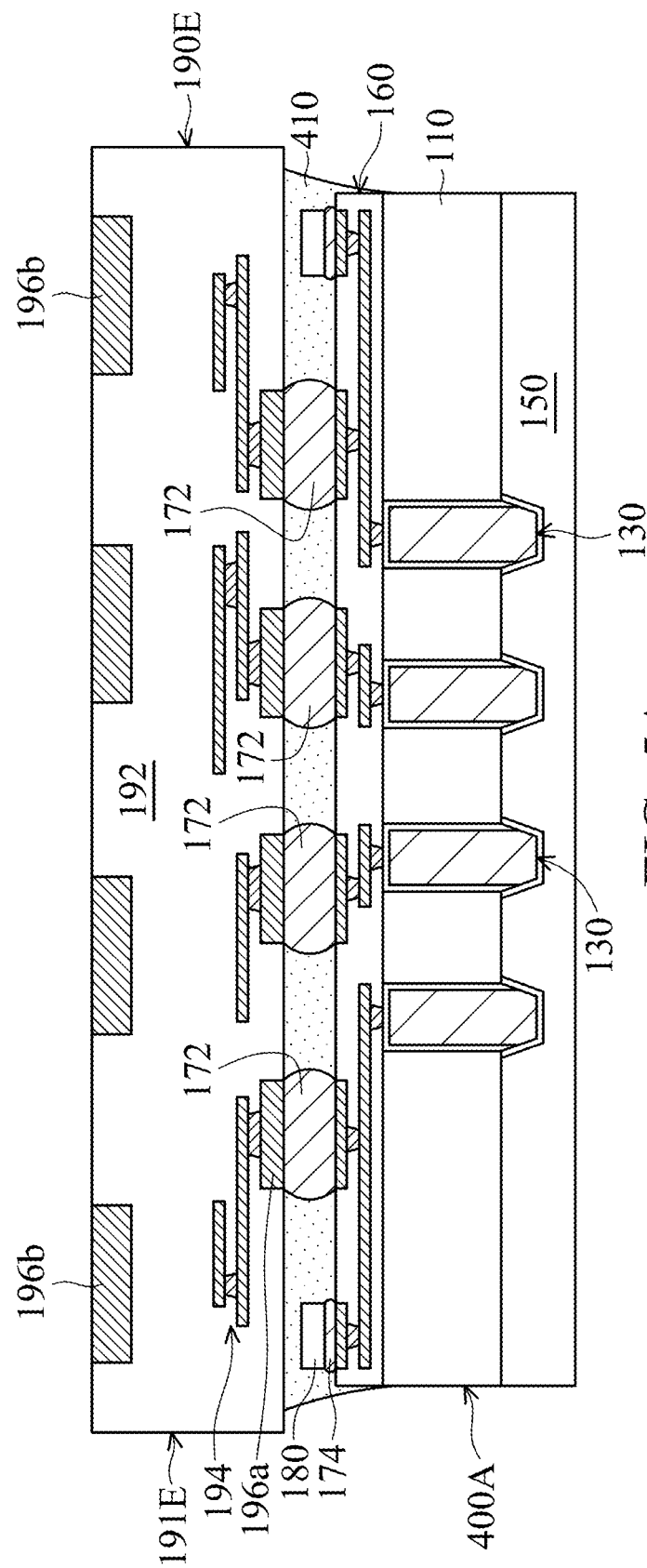
FIGS. 5A-5B are cross-sectional views of various stages of a process for forming a probe head structure, in accordance with some embodiments.
Figure 5B:
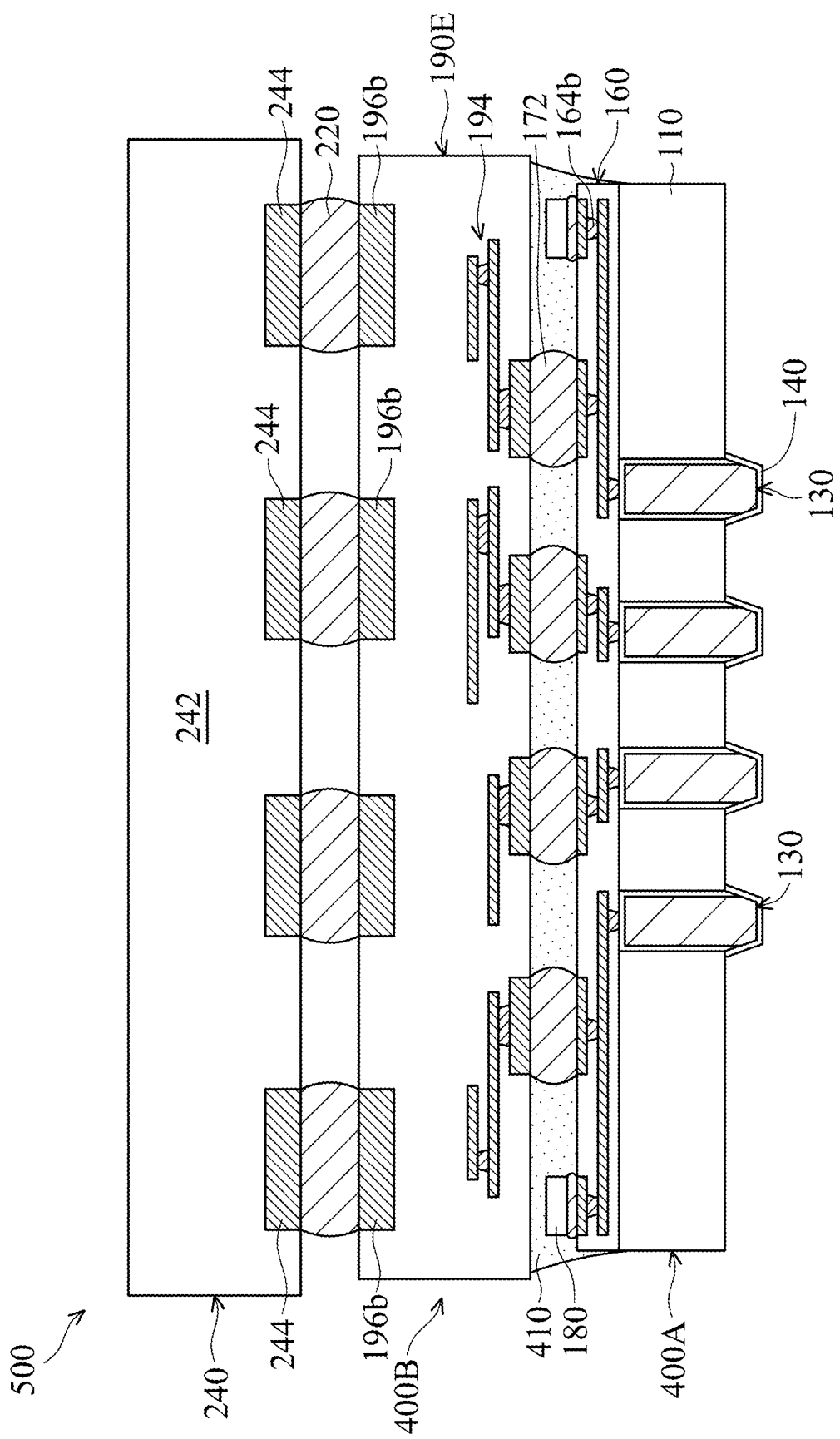

FIGS. 5A-5B are cross-sectional views of various stages of a process for forming a probe head structure, in accordance with some embodiments. As shown in FIG. 5A, after the step of FIG. 4A, a wiring substrate 190E is bonded to the redistribution structure 160 through the conductive bumps 172, in accordance with some embodiments. The wiring substrate 190E is formed by cutting through the wiring substrate 190 of FIG. 1I, in accordance with some embodiments. The wiring substrate 190E has planar sidewalls 191E, in accordance with some embodiments.

Thereafter, as shown in FIG. 5A, an underfill layer 410 is formed between the wiring substrate 190E and the redistribution structure 160, in accordance with some embodiments. The underfill layer 410 surrounds the devices 180, the conductive bumps 172 and 174, the redistribution structure 160, and the substrate 110, in accordance with some embodiments. The underfill layer 410 is made of an insulating material, such as a polymer material, in accordance with some embodiments.

As shown in FIG. 5B, the steps of FIGS. 1J, 1K and 1M are performed to remove the protective film 150 and to form the conductive bumps 220 and the circuit board 240, in accordance with some embodiments. In this step, a probe head structure 500 is substantially formed, in accordance with some embodiments.

Figure 6:
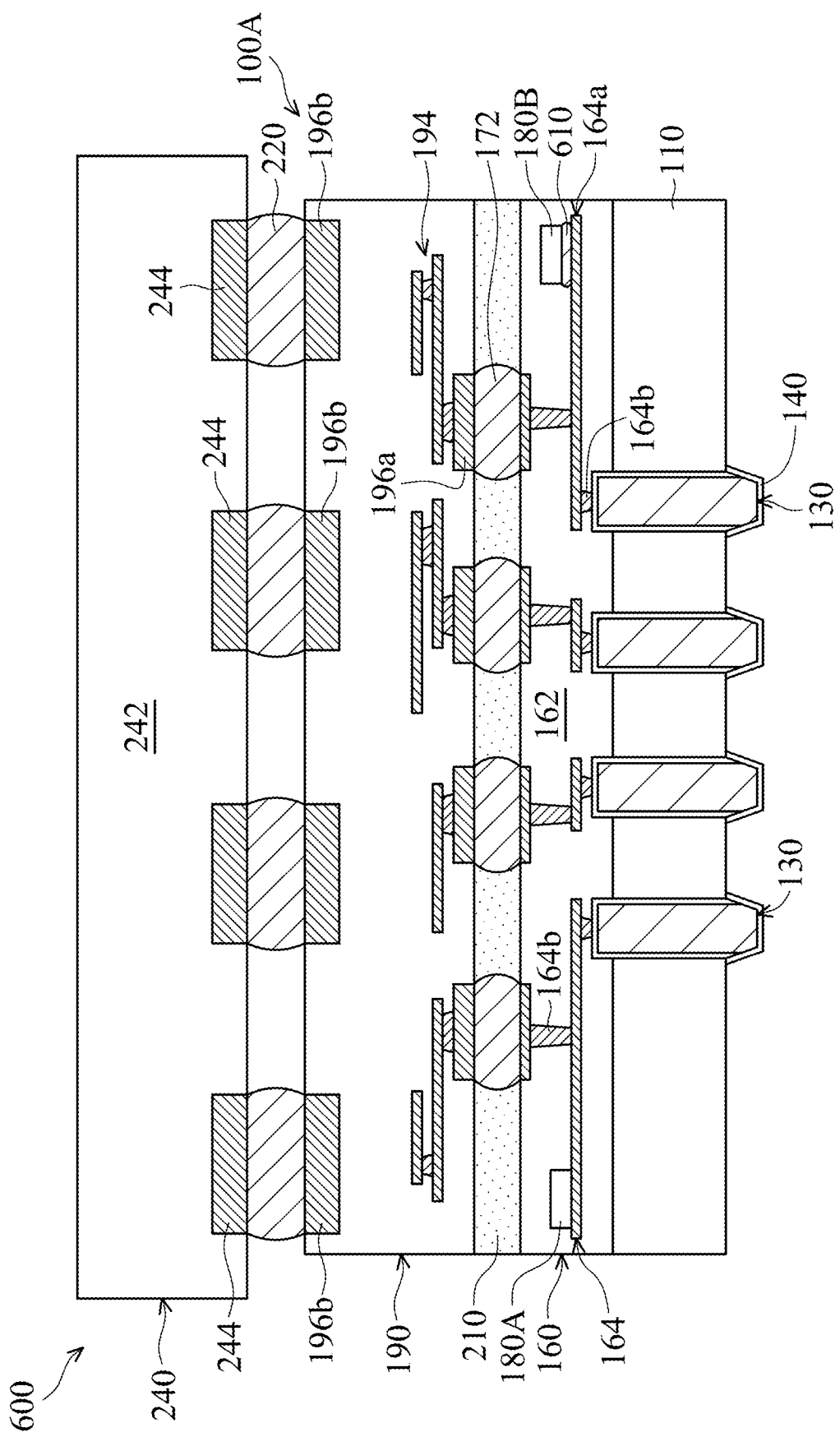
FIG. 6 is a cross-sectional view of a probe head structure, in accordance with some embodiments.

FIG. 6 is a cross-sectional view of a probe head structure 600, in accordance with some embodiments. As shown in FIG. 6, the probe head structure 600 is similar to the probe head structure 100 of FIG. 1M, except that devices 180A and 180B are in the dielectric structure 162, in accordance with some embodiments.

The device 180A is bonded to the wiring layer 164a by a diffusion bond, in accordance with some embodiments. The device 180A is in direct contact with the wiring layer 164a, in accordance with some embodiments. The device 180B is bonded to the wiring layer 164a through a solder layer 610 therebetween, in accordance with some embodiments.

The solder layer 610 is made of a conductive material, such as metal (e.g., tin or the like) or alloys thereof, in accordance with some embodiments. The devices 180A and 180B are electrically connected to the probe pillar 130 through the wiring structure 164, in accordance with some embodiments.

Since the devices 180A and 180B are able to be formed in the redistribution structure 160, the number (or the quantity) of the devices 180A and 180B may be increased according to requirements without occupying the layout space over the redistribution structure 160, in accordance with some embodiments.

The formation of the devices 180A and 180B in the redistribution structure 160 is able to shorten the length of the conductive path between the devices 180A and 180B and the probe pillars 130, in accordance with some embodiments. As a result, the electrical performance of the probe head structure 600 is improved, in accordance with some embodiments.

Processes and materials for forming the probe head structures 400, 500, and 600 may be similar to, or the same as, those for forming the probe head structure 100 described above.

In accordance with some embodiments, probe head structures and methods for forming the same are provided. The methods (for forming the probe head structure) form probe pillars by forming a conductive layer in through holes of a substrate and thereafter partially removing the substrate from a surface of the substrate such that protruding portions of the conductive layer originally in the through holes protrude from the surface. Therefore, the methods are able to reduce the width and the pitch of the probe pillars by reducing the width and the pitch of the through holes of the substrate.

As a result, the probe head structures with the small-width and fine-pitch probe pillars are able to be used to test a to-be-tested substrate with small-width and fine-pitch pads during a circuit probing test process. The circuit probing test process includes a wafer-level testing process, in accordance with some embodiments.

In accordance with some embodiments, a probe head structure is provided. The probe head structure includes a substrate having a top surface and a bottom surface. The probe head structure includes a first probe pillar passing through the substrate. The first probe pillar has a first protruding portion protruding from the bottom surface. The probe head structure includes a redistribution structure on the top surface of the substrate and the first probe pillar. The redistribution structure is in direct contact with the substrate and the first probe pillar, the redistribution structure includes a dielectric structure and a wiring structure in the dielectric structure, and the wiring structure is electrically connected to the first probe pillar. The probe head structure includes a wiring substrate over the redistribution structure. The probe head structure includes a first conductive bump connected between the wiring substrate and the redistribution structure.

In accordance with some embodiments, a probe head structure is provided. The probe head structure includes a substrate having a top surface and a bottom surface. The probe head structure includes a probe pillar passing through the substrate. The probe pillar has a protruding portion protruding from the bottom surface, and the probe pillar includes a conductive pillar and a seed layer between the conductive pillar and the substrate and surrounding the conductive pillar. The probe head structure includes a redistribution structure over the top surface of the substrate and the probe pillar, wherein a first sidewall of the redistribution structure is substantially level with a second sidewall of the substrate. The probe head structure includes a wiring substrate over the redistribution structure. The probe head structure includes a conductive bump connected between the wiring substrate and the redistribution structure.

In accordance with some embodiments, a method for forming a probe head structure is provided. The method includes forming a probe pillar in a flexible substrate. The probe pillar passes through the flexible substrate, and the flexible substrate has a first surface and a second surface opposite to the first surface. The method includes partially removing the flexible substrate from the first surface, wherein a protruding portion of the probe pillar protrudes from the first surface after partially removing the flexible substrate. The method includes forming a redistribution structure over the second surface of the flexible substrate. The method includes bonding a wiring substrate to the redistribution structure through a conductive bump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a probe head structure, comprising:
    forming a probe pillar in a flexible substrate, wherein the probe pillar passes through the flexible substrate, and the flexible substrate has a first surface and a second surface opposite to the first surface;
    partially removing the flexible substrate from the first surface, wherein a protruding portion of the probe pillar protrudes from the first surface after partially removing the flexible substrate;
    forming a conductive material layer over the protruding portion and the first surface of the flexible substrate, wherein the conductive material layer has a thick portion and a thin portion thinner than the thick portion, the thick portion covers the protruding portion, and the thin portion covers the first surface of the flexible substrate;
    thinning the conductive material layer until the first surface of the flexible substrate is exposed, wherein the thick portion remaining over the protruding portion forms a conductive layer after the conductive material layer is thinned;
    forming a redistribution structure over the second surface of the flexible substrate; and
    bonding a wiring substrate to the redistribution structure through a conductive bump.

2. The method for forming the probe head structure as claimed in claim 1, wherein the redistribution structure is in direct contact with the flexible substrate and the probe pillar.

3. The method for forming the probe head structure as claimed in claim 1, wherein the partial removal of the flexible substrate comprises:
    partially removing the probe pillar adjacent to the first surface of the flexible substrate.

4. The method for forming the probe head structure as claimed in claim 1, further comprising:
    performing a cutting process to cut through the redistribution structure and the flexible substrate before bonding the wiring substrate to the redistribution structure.

5. The method for forming the probe head structure as claimed in claim 1, further comprising:
    performing a cutting process to cut through the flexible substrate, the redistribution structure, and the wiring substrate after bonding the wiring substrate to the redistribution structure.

6. The method for forming the probe head structure as claimed in claim 5, further comprising:
    forming an underfill layer between the wiring substrate and the redistribution structure before performing the cutting process, wherein the cutting process further cuts through the underfill layer.

7. The method for forming the probe head structure as claimed in claim 1, wherein an end surface of the probe pillar is substantially level with the second surface of the flexible substrate.

8. The method for forming the probe head structure as claimed in claim 1, wherein the redistribution structure is softer than the flexible substrate.

9. The method for forming the probe head structure as claimed in claim 1, wherein the redistribution structure is thinner than the flexible substrate.

10. The method for forming the probe head structure as claimed in claim 1, wherein the conductive material layer is thinned using an etching process.

11. The method for forming the probe head structure as claimed in claim 1, wherein the conductive material layer is formed using a deposition process.

12. A method for forming a probe head structure, comprising:
    forming a probe pillar in a flexible substrate, wherein the probe pillar passes through the flexible substrate, and the flexible substrate has a first surface and a second surface opposite to the first surface;
    partially removing the flexible substrate from the first surface, wherein a protruding portion of the probe pillar protrudes from the first surface after partially removing the flexible substrate;
    forming a conductive material layer over the protruding portion and the first surface of the flexible substrate, wherein the conductive material layer has a thick portion and a thin portion thinner than the thick portion, the thick portion covers the protruding portion, the thin portion covers the first surface of the flexible substrate, the conductive material layer conformally and continuously covers the protruding portion and the first surface of the flexible substrate;
    thinning the conductive material layer until the first surface of the flexible substrate is exposed, wherein the thick portion remaining over the protruding portion forms a conductive layer after the conductive material layer is thinned;

forming a redistribution structure over the second surface of the flexible substrate; and bonding a wiring substrate to the redistribution structure through a conductive bump.

13. The method for forming the probe head structure as claimed in claim 12, further comprising:

forming a second probe pillar in the flexible substrate, wherein the redistribution structure has a first bonding pad and a second bonding pad, the first bonding pad and the second bonding pad are respectively and electrically connected to the first probe pillar and the second probe pillar, and a first distance between the first probe pillar and the second probe pillar is less than a second distance between the first bonding pad and the second bonding pad.

14. The method for forming the probe head structure as claimed in claim 13, wherein the wiring substrate has a third bonding pad and a fourth bonding pad, the third bonding pad is bonded to the first bonding pad through a first conductive bump, the fourth bonding pad is bonded to the second bonding pad through a second conductive bump, and the second distance between the first bonding pad and the second bonding pad is less than a third distance between the third bonding pad and the fourth bonding pad.

15. The method for forming the probe head structure as claimed in claim 12, wherein the conductive material layer is thinned using an etching process.

16. The method for forming the probe head structure as claimed in claim 12, wherein the conductive material layer is formed using a deposition process.

17. A method for forming a probe head structure, comprising:

forming a probe pillar in a flexible substrate, wherein the probe pillar passes through the flexible substrate, and the flexible substrate has a first surface and a second surface opposite to the first surface;

partially removing the flexible substrate from the first surface, wherein a protruding portion of the probe pillar protrudes from the first surface after partially removing the flexible substrate, the protruding portion has an end surface, a first sidewall, and a second sidewall, the end surface is a planar surface facing away from the flexible substrate and connected between the first sidewall and the second sidewall, and a distance between the first sidewall and the second sidewall increases toward the flexible substrate;

forming a conductive material layer over the protruding portion and the first surface of the flexible substrate, wherein the conductive material layer has a thick portion and a thin portion thinner than the thick portion, the thick portion covers the protruding portion, and the thin portion covers the first surface of the flexible substrate;

thinning the conductive material layer until the first surface of the flexible substrate is exposed, wherein the thick portion remaining over the protruding portion forms a conductive layer after the conductive material layer is thinned;

forming a redistribution structure over the second surface of the flexible substrate; and bonding a wiring substrate to the redistribution structure through a conductive bump.

18. The method for forming the probe head structure as claimed in claim 17, further comprising:

bonding a circuit board to the wiring substrate.

19. The method for forming the probe head structure as claimed in claim 17, wherein the conductive material layer is formed using a deposition process.

20. The method for forming the probe head structure as claimed in claim 17, wherein the conductive material layer is thinned using an etching process.

* * * * *